(12) United States Patent
Farmer et al.

(10) Patent No.: US 9,063,289 B1
(45) Date of Patent: Jun. 23, 2015

(54) MULTIMODE FIBER COMBINERS

(75) Inventors: Jason N. Farmer, Vancouver, WA (US);
Ronii C. Mehl, Vancouver, WA (US);
Robert G. Waarts, Vancouver, WA (US)

(73) Assignee: nLight Photonics Corporation, Vancouver, WA (US)

( * ) Notice: Subject to any disclaimer, the term of this patent is extended or adjusted under 35 U.S.C. 154(b) by 1260 days.

(21) Appl. No.: 12/495,746

(22) Filed: Jun. 30, 2009

Related U.S. Application Data

(60) Provisional application No. 61/077,122, filed on Jun. 30, 2008.

(51) Int. Cl.
*G02B 6/26* (2006.01)
*G02B 6/28* (2006.01)
*G02B 6/287* (2006.01)

(52) U.S. Cl.
CPC . *G02B 6/28* (2013.01); *G02B 6/287* (2013.01); *G02B 6/2835* (2013.01); *G02B 6/2856* (2013.01)

(58) Field of Classification Search
USPC ............... 385/27–32, 39, 41–46, 122–128
See application file for complete search history.

(56) References Cited

U.S. PATENT DOCUMENTS

| | | | |
|---|---|---|---|
| 3,505,046 A * | 4/1970 | Phaneuf | 65/410 |
| 4,046,537 A * | 9/1977 | Deserno et al. | 65/403 |
| 4,072,399 A | 2/1978 | Love | |
| 4,179,185 A | 12/1979 | Hawk | |
| 4,773,924 A | 9/1988 | Berkey | |
| 4,818,062 A | 4/1989 | Scifres et al. | |
| 5,011,251 A * | 4/1991 | Miller et al. | 385/43 |
| 5,017,206 A | 5/1991 | Miller et al. | |
| 5,153,932 A | 10/1992 | Blyler, Jr. et al. | |
| 5,259,046 A | 11/1993 | DiGiovanni et al. | |
| 5,295,210 A | 3/1994 | Nolan et al. | |
| 5,295,211 A * | 3/1994 | Weidman | 385/43 |
| 5,305,414 A * | 4/1994 | Higby et al. | 385/142 |
| 5,408,554 A | 4/1995 | Cryan et al. | |
| 5,448,673 A * | 9/1995 | Murphy et al. | 385/123 |

(Continued)

FOREIGN PATENT DOCUMENTS

| | | |
|---|---|---|
| RU | 2176840 C2 | 12/2001 |
| WO | WO 92/10014 | 6/1992 |

(Continued)

OTHER PUBLICATIONS

Geshiro et al., "Truncated parabolic-index fiber with minimum mode dispersion," IEEE Transaction on Microwave Theory and Technology, 26(2):115-119, 1978.

(Continued)

*Primary Examiner* — Ryan Lepisto
*Assistant Examiner* — Guy Anderson
(74) *Attorney, Agent, or Firm* — Klarquist Sparkman, LLP

(57) ABSTRACT

Multimode beam combiners include at least one gradient-step index optical fiber in which a refractive index difference at a core/cladding interface is selected to provide a numerical aperture so as to provide stable, uniform beam output. One or more such fibers is formed into a tapered bundle than can be shaped to provide a selected illuminated aperture. The fibers in the bundle can be separated by respective tapered claddings so as to be optically coupled or uncoupled. Illumination systems can include a plurality of such fibers coupled to a plurality of laser diodes or other light sources.

48 Claims, 17 Drawing Sheets

(56) References Cited

U.S. PATENT DOCUMENTS

| | | | |
|---|---|---|---|
| 5,461,692 A | 10/1995 | Nagel | |
| 5,568,318 A | 10/1996 | Leger et al. | |
| 5,579,422 A | 11/1996 | Head et al. | |
| 5,629,997 A | 5/1997 | Hardy | |
| 5,664,037 A | 9/1997 | Weidman | |
| 5,668,903 A | 9/1997 | Neuberger et al. | |
| 5,715,270 A | 2/1998 | Zediker | |
| 5,729,643 A | 3/1998 | Hmelar et al. | |
| 5,734,766 A | 3/1998 | Flint | |
| 5,745,284 A | 4/1998 | Goldberg et al. | |
| 5,818,630 A | 10/1998 | Fermann et al. | |
| 5,825,803 A | 10/1998 | Labranche | |
| 5,864,644 A | 1/1999 | DiGiovanni et al. | |
| 5,873,923 A | 2/1999 | DiGiovanni | |
| 5,887,097 A | 3/1999 | Henry et al. | |
| 5,935,288 A | 8/1999 | DiGiovanni et al. | |
| 5,949,932 A | 9/1999 | Lawrenz-Stolz | |
| 6,031,953 A | 2/2000 | Rekow et al. | |
| 6,044,096 A | 3/2000 | Wolak et al. | |
| 6,078,716 A | 6/2000 | Huang et al. | |
| 6,101,199 A | 8/2000 | Wang et al. | |
| 6,134,362 A | 10/2000 | Au-Yeung et al. | |
| 6,198,858 B1 | 3/2001 | Pan et al. | |
| 6,272,268 B1* | 8/2001 | Miller et al. | 385/43 |
| 6,278,816 B1 | 8/2001 | Keur et al. | |
| 6,292,608 B1* | 9/2001 | Toh | 385/43 |
| 6,385,371 B1 | 5/2002 | Li | |
| 6,397,636 B1 | 6/2002 | DiGiovanni et al. | |
| 6,404,954 B1 | 6/2002 | Zhu et al. | |
| 6,421,489 B1 | 7/2002 | Berkey et al. | |
| 6,434,295 B1 | 8/2002 | MacCormack et al. | |
| 6,434,302 B1 | 8/2002 | Fidric et al. | |
| 6,496,301 B1 | 12/2002 | Koplow et al. | |
| 6,516,124 B2 | 2/2003 | Po | |
| 6,532,244 B1 | 3/2003 | Dewey et al. | |
| 6,608,951 B1 | 8/2003 | Goldberg et al. | |
| 6,666,590 B2 | 12/2003 | Brosnan | |
| 6,668,112 B1 | 12/2003 | Kaneda | |
| 6,700,709 B1 | 3/2004 | Fermann | |
| 6,731,837 B2 | 5/2004 | Goldberg et al. | |
| 6,778,732 B1 | 8/2004 | Fermann | |
| 6,816,652 B1 | 11/2004 | Lin et al. | |
| 6,868,236 B2 | 3/2005 | Wiltsey et al. | |
| 6,907,163 B2 | 6/2005 | Lewis | |
| 6,956,876 B1 | 10/2005 | Aquaro et al. | |
| 6,970,624 B2* | 11/2005 | DiGiovanni et al. | 385/43 |
| 6,990,278 B2 | 1/2006 | Vakili et al. | |
| 7,016,573 B2 | 3/2006 | Dong et al. | |
| 7,046,432 B2 | 5/2006 | Starodoumov | |
| 7,046,875 B2 | 5/2006 | Gonthier et al. | |
| 7,209,615 B2 | 4/2007 | Fishteyn | |
| 7,221,822 B2 | 5/2007 | Borisovich et al. | |
| 7,236,671 B2 | 6/2007 | Rasmussen | |
| 7,272,956 B1 | 9/2007 | Anikitchev et al. | |
| 7,327,920 B2 | 2/2008 | Dong et al. | |
| 7,420,996 B2 | 9/2008 | Schulte et al. | |
| 7,436,868 B2 | 10/2008 | Schulte et al. | |
| 7,437,046 B2* | 10/2008 | DiGiovanni et al. | 385/128 |
| 7,443,895 B2 | 10/2008 | Schulte et al. | |
| 7,526,165 B2 | 4/2009 | Nielsen et al. | |
| 7,532,792 B2 | 5/2009 | Skovaard et al. | |
| 7,539,377 B2 | 5/2009 | Gonthier | |
| 7,561,769 B2 | 7/2009 | Fujimoto et al. | |
| 7,574,087 B2 | 8/2009 | Inoue et al. | |
| 7,586,963 B2 | 9/2009 | Schulte et al. | |
| 7,606,452 B2 | 10/2009 | Bilodeau et al. | |
| 7,637,126 B2 | 12/2009 | Koeppler et al. | |
| 7,729,574 B2 | 6/2010 | Moriarty | |
| 7,760,978 B2* | 7/2010 | DiGiovanni et al. | 385/128 |
| 7,787,733 B2* | 8/2010 | DiGiovanni et al. | 385/128 |
| 7,957,432 B2 | 6/2011 | Seo et al. | |
| 7,991,255 B2 | 8/2011 | Salokatve | |
| 8,068,705 B2 | 11/2011 | Gapontsev et al. | |
| 8,213,070 B2 | 7/2012 | Koplow | |
| 8,248,688 B2 | 8/2012 | Baird et al. | |
| 8,346,038 B2 | 1/2013 | Gonthier | |
| 8,433,168 B2 | 4/2013 | Filippov et al. | |
| 8,457,456 B2 | 6/2013 | Kopp et al. | |
| 8,472,765 B2 | 6/2013 | Holland | |
| 8,483,533 B1 | 7/2013 | Mehl | |
| 8,498,046 B2 | 7/2013 | Dong et al. | |
| 8,711,471 B2 | 4/2014 | Liu et al. | |
| 2002/0172486 A1 | 11/2002 | Fermann | |
| 2003/0031442 A1 | 2/2003 | Siegman | |
| 2004/0228593 A1 | 11/2004 | Sun et al. | |
| 2005/0008044 A1 | 1/2005 | Fermann et al. | |
| 2005/0265653 A1* | 12/2005 | Cai et al. | 385/28 |
| 2005/0265678 A1 | 12/2005 | Manyam et al. | |
| 2007/0062222 A1 | 3/2007 | Janka et al. | |
| 2007/0086501 A1 | 4/2007 | Karlsen | |
| 2007/0116071 A1 | 5/2007 | Schulte et al. | |
| 2007/0116077 A1 | 5/2007 | Farmer et al. | |
| 2007/0196062 A1 | 8/2007 | Inoue et al. | |
| 2007/0237453 A1* | 10/2007 | Nielsen et al. | 385/28 |
| 2008/0050069 A1* | 2/2008 | Skovgaard et al. | 385/39 |
| 2008/0063348 A1 | 3/2008 | Kumano et al. | |
| 2008/0166094 A1 | 7/2008 | Bookbinder et al. | |
| 2008/0170823 A1 | 7/2008 | Gonthier | |
| 2009/0003788 A1* | 1/2009 | Galvanauskas | 385/126 |
| 2009/0010286 A1 | 1/2009 | Messaddeq et al. | |
| 2009/0060417 A1 | 3/2009 | Bilodeau et al. | |
| 2009/0092365 A1 | 4/2009 | Donlagic | |
| 2009/0136176 A1 | 5/2009 | Kopp et al. | |
| 2010/0111118 A1 | 5/2010 | Seo et al. | |
| 2010/0142894 A1 | 6/2010 | Gonthier | |
| 2010/0247047 A1 | 9/2010 | Filippov et al. | |
| 2010/0278486 A1 | 11/2010 | Holland | |
| 2011/0032602 A1 | 2/2011 | Rothenberg | |
| 2011/0032603 A1 | 2/2011 | Rothenberg | |
| 2011/0032604 A1 | 2/2011 | Rothenberg et al. | |
| 2011/0058250 A1 | 3/2011 | Liu et al. | |
| 2011/0069723 A1 | 3/2011 | Dong et al. | |
| 2011/0100066 A1 | 5/2011 | Bohme et al. | |
| 2011/0157671 A1 | 6/2011 | Koplow | |
| 2011/0305250 A1 | 12/2011 | Chann et al. | |
| 2012/0127563 A1 | 5/2012 | Farmer et al. | |
| 2012/0219026 A1 | 8/2012 | Saracco et al. | |
| 2012/0230352 A1 | 9/2012 | Minelly et al. | |
| 2012/0260781 A1 | 10/2012 | Price et al. | |

FOREIGN PATENT DOCUMENTS

| | | |
|---|---|---|
| WO | WO 97/42533 | 11/1997 |
| WO | WO 2005/022705 | 3/2005 |
| WO | WO 2009/043968 | 4/2009 |
| WO | WO 2011/066440 | 6/2011 |
| WO | WO 2013/102033 | 7/2013 |

OTHER PUBLICATIONS

Geshiro et al., "Analysis of wave modes in slab waveguide with truncate parabolic index," IEEE Jouranl of Quantum Electronics, 10(9):647-649, 1974.

International Search Report from International Application No. PCT/US2013/030569, dated Jul. 4, 2013, 3 pp.

Written Opinion from International Application No. PCT/US2013/030569, dated Jul. 4, 2013, 5 pp.

International Search Report from International Application No. PCT/US2012/072003, dated Apr. 4, 2013, 2 pp.

Written opinion from International Application No. PCT/US2012/072003, dated Apr. 4, 2013, 3 pp.

nLIGHT Corporation, "nLIGHT Introduces New Line of All Fiber Mode Field Tapers" Jan. 23, 2009 News Release, http://nlight.net/new/releases/92~nLIGHT-Introduces-New-Line-of-All-Fiber-Mode-Field, downloaded Jan. 18, 2014.

Eidam et al., "Femtosecond fiber CPA system emitting 830 W average output power," Opt. Lett. 35:94-96 (2010).

(56) References Cited

OTHER PUBLICATIONS

Russbueldt et al., "400 W Yb:YAG Innoslab fs-amplifier," Optics Express 17:12230-12245 (2009).

Stolzenburg et al., "Picosecond Regenerative Yb:YAG Thin Disk Amplifier at 200 kHz Repetition Rate and 62 W Output Power," Advanced Solid-State Photonics, OSA Tech Digest, MA6 (2007).

Jauregui et al., "All-fiber Side Pump Combiner for High Power Fiber Lasers and Amplifiers," Proc. of SPIE, 7580:75801E-1-75801E-8 (2010).

"Pump and Signal Taper for Airclad Fibers Final Report," Air Force Research Laboratory, 8 pages (May 1, 2006).

Niels Asger Mortensen, "Air-clad fibers: pump absorption assisted by chaotic wave dynamics?," Optics Express 15:8988-8996 (Jul. 5, 2007).

International Search Report from PCT Publication No. PCT/US2013/077242, 2pp. (dated May 22, 2014).

International Search Report from PCT Publication No. PCT/US2013/077243, 2pp. (dated Apr. 17, 2014).

Written Opinion from PCT Publication No. PCT/US2013/077242, 4pp. (dated May 22, 2014).

Written Opinion from PCT Publication No. PCT/US2013/077243, 4pp. (dated Apr. 17, 2014).

* cited by examiner

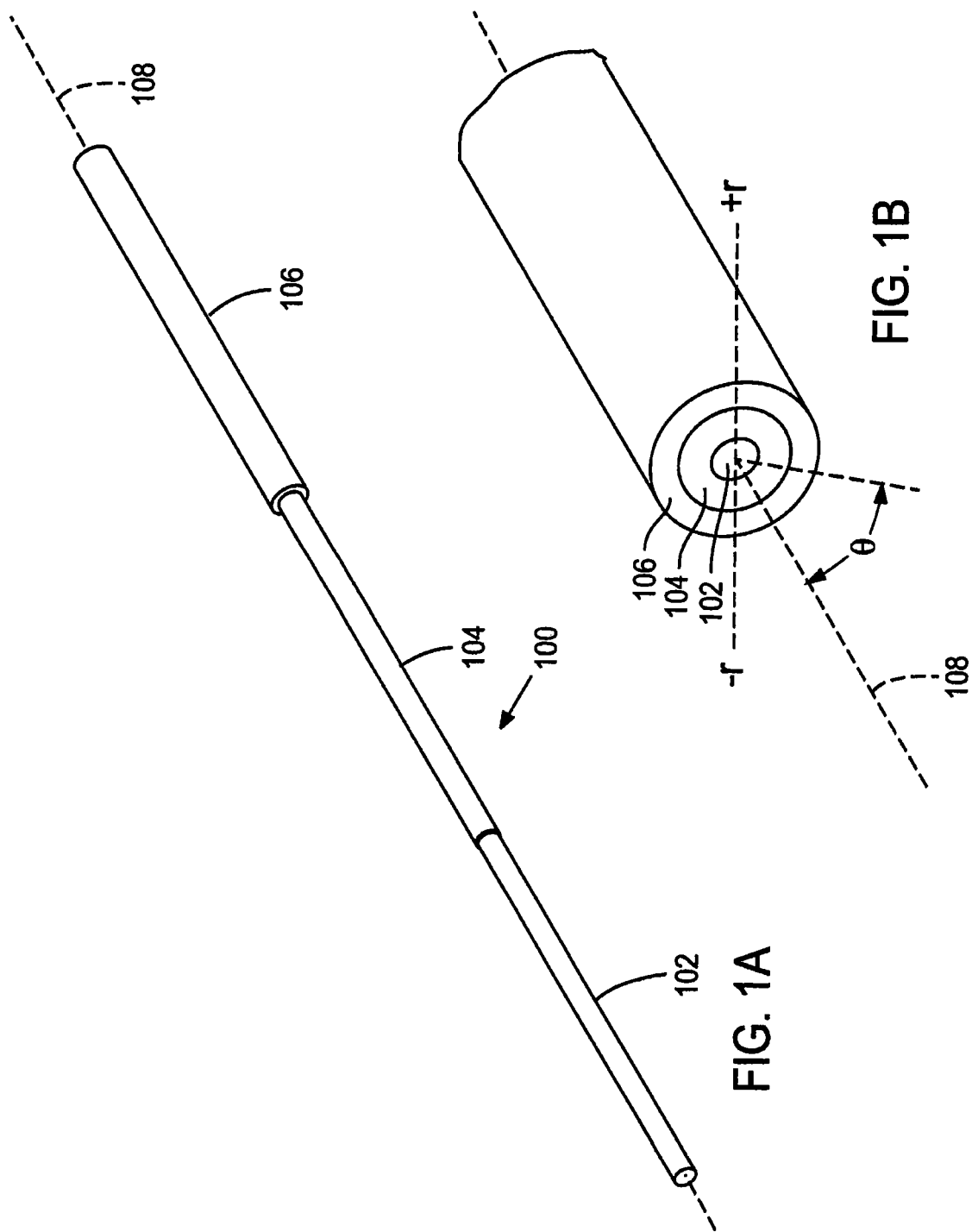

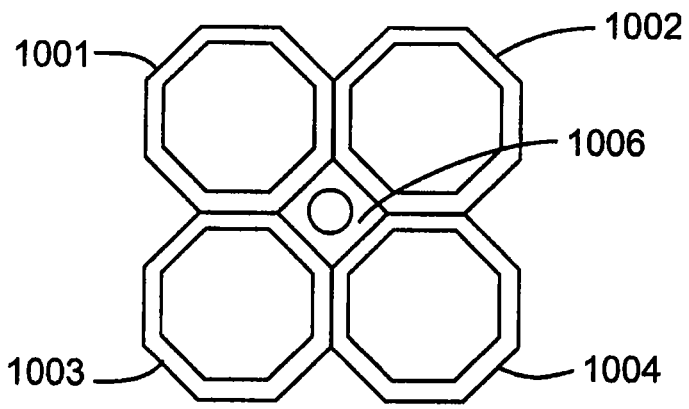
FIG. 10B
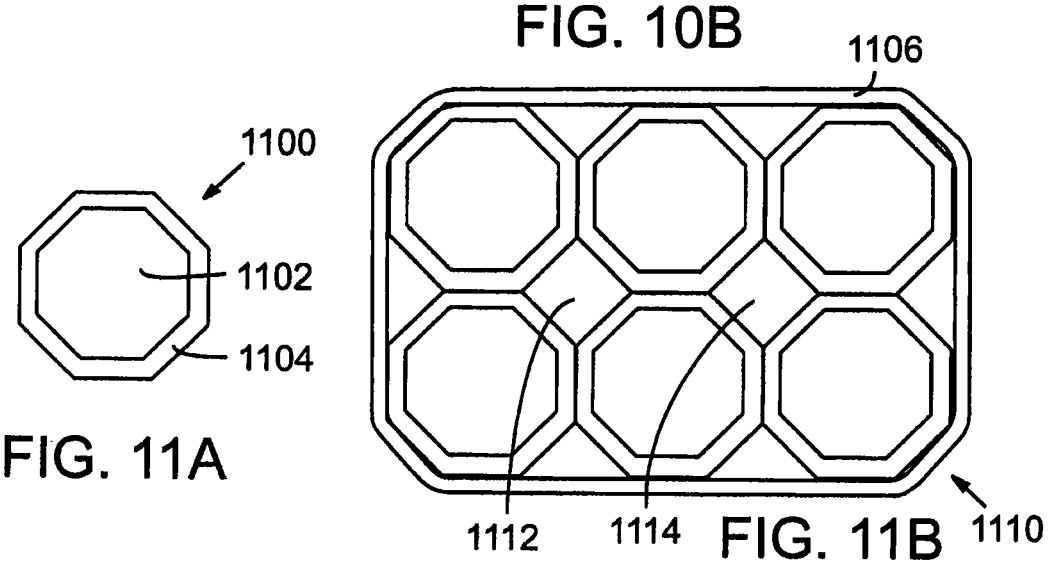
FIG. 11A
FIG. 11B
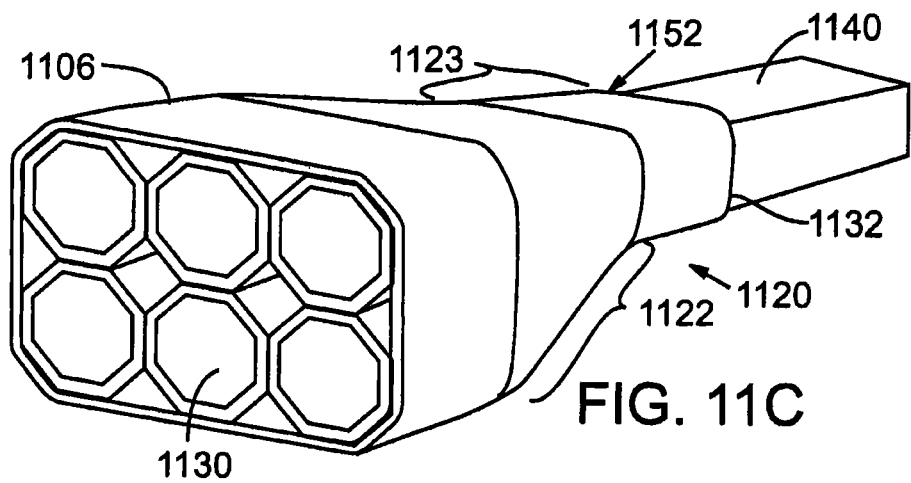
FIG. 11C

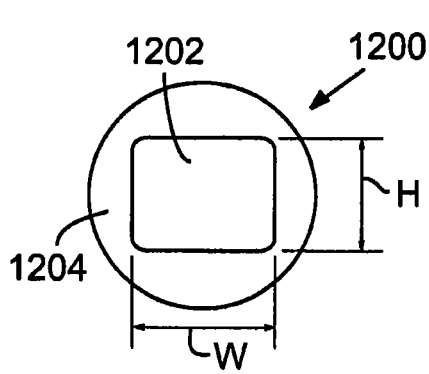
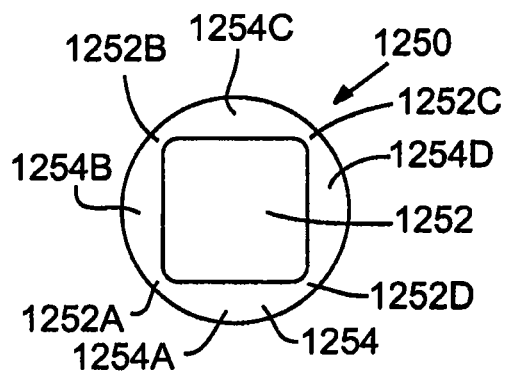
FIG. 12A    FIG. 12B
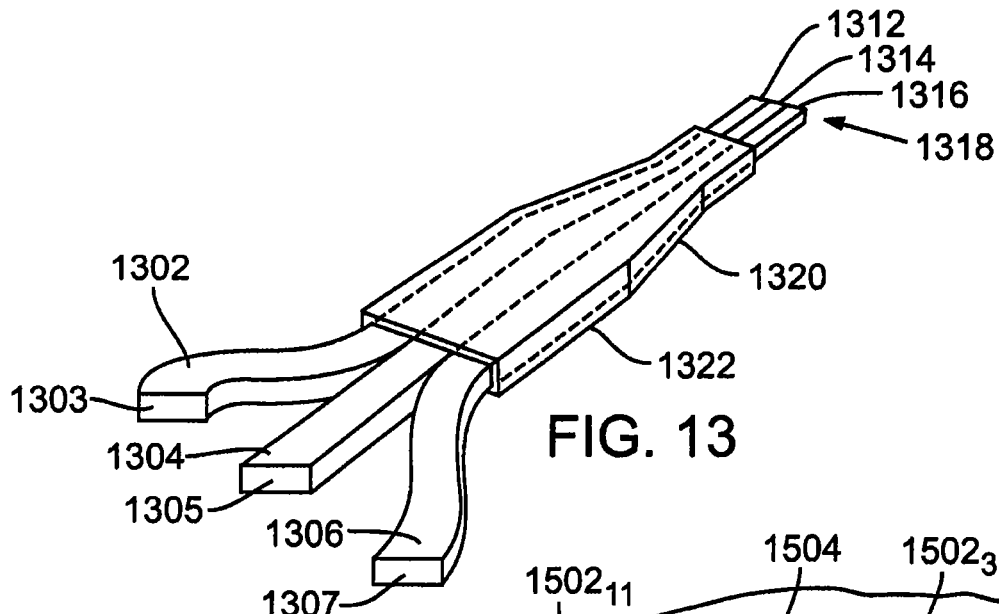
FIG. 13
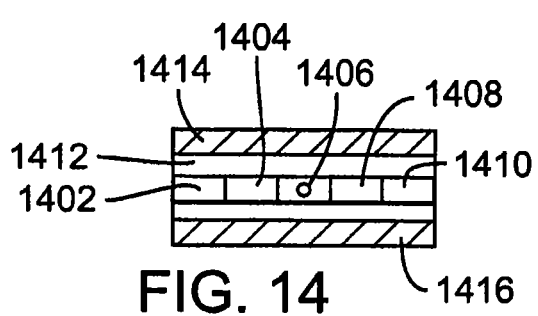
FIG. 14
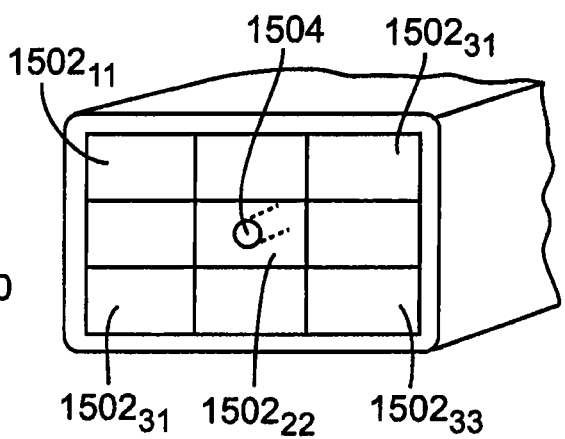
FIG. 15

MULTIMODE FIBER COMBINERS

CROSS REFERENCE TO RELATED APPLICATIONS

This application claims the benefit of U.S. Provisional Application 61/077,122, filed Jun. 30, 2008, that is incorporated herein by reference.

BACKGROUND

High power semiconductor lasers play an important role in a wide variety of applications including direct materials processing and pumping diode pumped solid state lasers and cladding pumped fiber lasers. Achieving the power levels required for these applications is often accomplished by combining the outputs of many lower power laser diodes. As the light output from laser diodes is highly divergent it is often convenient to make use of fiber coupled laser diodes and perform the beam combination with a fiber based beam combiner.

Numerous examples of such beam combiners have been described in the literature. For example, U.S. Pat. No. 5,864,644 to DiGiovanni et al. describes a cladding pumped optical fiber device. The device is based on an architecture that uses a plurality of multimode fiber coupled laser diodes that are each optically coupled to the cladding of a fiber laser. In this geometry, numerous fibers are brought together to a bundled region where they are fused and tapered to a smaller diameter. The bundle is subsequently cleaved and spliced to the cladding of the circular cross section active fiber.

While the fiber based combiner described by DiGiovanni et al. was specific to a cladding pumped device, such combiners can find other applications. Unfortunately, limitations associated with DiGiovanni's combiner and other similarly described devices (referred to herein after as "standard combiners") have limited their utility in other applications.

One limitation is that the far field pattern generated by standard combiners is sensitive to the routing of the fiber. Small changes in the path of the fiber, as can result from touching or moving the fiber, can result in dramatic changes to the output beam profile. While these changes in far field profile may have little impact in low absorption cladding pumped devices due to the exceptionally long interaction length, they have a severe impact in applications that have reduced interaction lengths, for example, direct materials processing or pumping high absorption laser gain materials such as rare earth doped crystals or highly doped optical fibers.

Another limitation of standard couplers is that the output beam generated by such devices is round. In materials processing applications, there are many applications that benefit from a square or rectangular beam profile. In these applications, a beam is typically scanned along the surface of material that is being treated or otherwise altered. When a circular beam is scanned across the material, the portion of the material that is exposed to the center of the beam experiences a much higher overall dosage of radiation than the portion that is exposed to the edge of the beam. This variation in total dosage leads to an undesirable non-uniformity in the material processing parameters. A coupler is therefore needed that could provide a square or rectangular output beam.

SUMMARY OF THE INVENTION

An object of the present invention is to provide a multimode fiber based combiner whose output beam pattern is insensitive to external perturbations to the multimode fiber that is either before the combiner, part of the combiner or after the combiner.

Another object of the present invention is to provide a multimode fiber based combiner whose output beam pattern is insensitive to external perturbations and that has an optical feedthrough of low modal content A further object of the present invention is to provide a multimode fiber based beam combiner whose output can be square, rectangular, or any of a variety of other non-circular shapes.

A further object of the present invention is to provide a multimode fiber based beam combiner with a noncircular shape and that has an optical feedthrough of low modal content.

A further object of this invention is to provide a method for optimally maintaining the intrinsic brightness of laser diode radiation as it is delivered through a fiber optic assembly.

A further object of the present invention is to provide a method for optimally pumping a cladding pumped device.

Beam combiners comprise at least a first optical fiber and a second optical fiber wherein at least one of the first and second optical fibers is a gradient-step fiber. The first and second fibers having respective independently positionable input portions and extend into a bundled fiber portion that defines an output surface. Optical radiation provided to the first and second optical fibers is coupled to at least a portion of the output surface. In some examples, optical radiation from either the first optical fiber, the second optical fiber, or both is coupled to a common output area on the output surface, while in other examples, optical radiation from the first and second fibers does not overlap on the output surface, or only partially overlaps. In typical examples, the bundled portion is tapered so as to decrease diameters of the first and second fibers by a factor of at least about 1.5, 2, 2.5, or 3. In some embodiments, an outer cladding is situated about the bundled fiber portion. In other examples, claddings of the first and second fibers separate the first and second fibers by at least about 4 μm in the bundled portion.

In some representative examples, beam combiners comprise a plurality of gradient-step index optical fibers and at least one of the plurality of gradient-step index fibers is centrally located in the bundled fiber portion. In an example, the plurality of fibers includes seven fibers, wherein one fiber is centrally located and fiber cladding situated in at least the bundled fiber portion is configured so that optical radiation propagates substantially independently in the fibers. In other examples, the plurality of fibers includes seven fibers, and a gradient-step fiber centrally located in the fiber bundle has a maximum core refractive index that is larger than a maximum core refractive index of the fibers situated about the centrally located fiber.

In some embodiments, the gradient-step fibers have substantially rectangular cross-sectional areas. In other representative examples, a centrally located fiber of the plurality of fibers includes a single mode core or a few mode core situated within a multimode gradient index core. In other examples, a glass cladding is situated about the bundled fiber portion. In other examples, a cladding of at least one gradient-step index fiber has a refractive index $n_{CLAD}$, a core has a refractive index $n(0)$ near a core center and a refractive index $n(r_{MAX})$ at a core/cladding interface, wherein $n^2(r_{MAX})-n^2_{CLAD}$ is in a range of between about $[n^2(0)-n^2(r_{MAX})]/10$ and $2[n^2(0)-n^2(r_{MAX})]$. In some examples, $n_2(r_{MAX})-n^2_{CLAD}$ is approximately equal to $n^2(0)-n^2(r_{MAX})$. In other examples, at least one of the first fiber and the second fiber is a double clad fiber having a gradient index core. In some examples, gradient index cores have refractive indices that are approximately equal to $$n(0)\left(1 - B\frac{r^2}{2}\right)$$

for $|r|<r_{MAX}$, wherein r is a radial distance from a core center, $r_{MAX}$ is a radius of the core, n(0) is core refractive index at r=0, and B is a constant. In some examples, a cladding has a refractive index $n_{CLAD}$, and $n^2(r_{MAX})-n^2_{CLAD}$ is approximately equal to $n^2(0)-n^2(r_{MAX})$.

Optical illuminators comprise a plurality of light sources coupled to respective gradient-step fibers, wherein portions of the gradient-step fibers define a tapered fiber bundle that includes an output portion configured to deliver optical radiation from the plurality of light sources. In some examples, the gradient-step fibers include claddings and gradient index cores such that numerical apertures defined by respective core/cladding refractive index differences are at least about 0.06. In typical embodiments, an output fiber is spliced to the tapered fiber bundle and the light sources are laser diodes. In other examples, a double clad fiber is spliced to the tapered fiber bundle, wherein the double clad fiber include a rare earth doped single mode core and a cross sectional area of the tapered fiber bundle corresponds to a cross sectional area of the double clad fiber. In further examples, the tapered fiber bundle includes a single mode core having a mode field diameter corresponding to a mode field diameter of the rare earth doped single mode core. In some representative embodiments, a maximum refractive index difference associated with the gradient index cores are substantially the same as refractive index differences associated with respective core/cladding interfaces. In other examples, the tapered fiber output portion defines an output area that is substantially rectangular and the gradient-step fibers have cross-sectional areas that taper by at least about a factor of 1.5 in the tapered fiber bundle.

In some embodiments, portions of the gradient-step fibers that define the tapered fiber bundle are configured in a linear array along an array axis in the tapered fiber bundle, the tapered fiber bundle having first and second contact surfaces parallel to the array axis and an illumination propagation axis. At least one thermal control device is thermally contacted to at least one of the first and second contact surfaces. In other examples, a light source controller is configured to independently adjust the optical radiation provided by the light sources. In some examples, the light source controller is coupled to a detection system, and is configured to adjust light source optical power based on optical power sensed by the detection system.

BRIEF DESCRIPTION OF THE DRAWINGS

FIGS. 1A-1B illustrate a representative graded index multimode fiber having a gradient index core and an index step at a core/cladding interface.

FIGS. 10A-10B illustrate an array of fibers that includes a double clad central fiber that includes a low mode area feedthrough FIG. 11A is a sectional view of a step index optical fiber having an octagonal cross section.

FIGS. 11B-11C illustrate a tapered coupler based on octagonal optical fibers such as illustrated in FIG. 11A.

FIGS. 12A-12B are sectional views of optical fibers having rectangular or square cores and circular claddings.

FIG. 13 is a perspective view of a fiber coupler that includes a plurality of rectangular fibers fused to form a tapered region.

FIG. 14 is a sectional view of a one dimensional fiber array coupled to top and bottom heat sinks.

FIG. 15 is a perspective view of an array of fibers that includes a double clad central fiber having a doped core configured to serve as a laser gain medium.

DETAILED DESCRIPTION

Figure 2A:
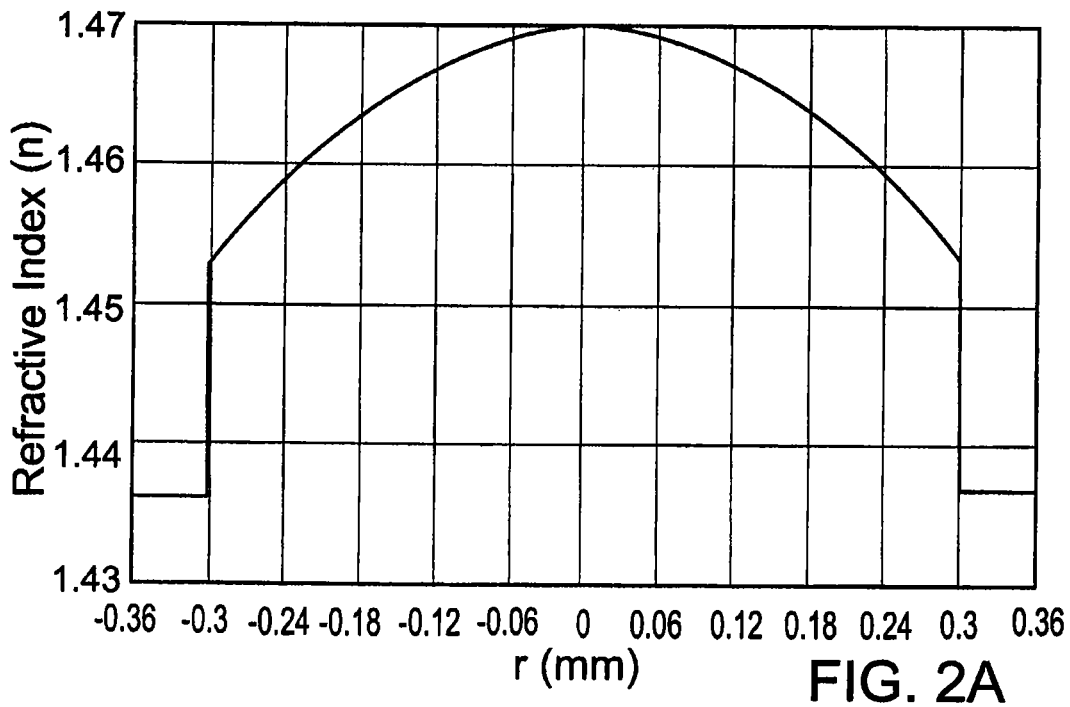
FIG. 2A is a graph of refractive index as a function of radial distance from a fiber propagation axis for the example optical fiber illustrated in FIGS. 1A-1B.

As used in this application and in the claims, the singular forms "a," "an," and "the" include the plural forms unless the context clearly dictates otherwise. Additionally, the term "includes" means "comprises." Further, the term "coupled" means optically or mechanically coupled or linked and does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved.

Although the operations of some of the disclosed embodiments are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

Theories of operation, scientific principles, or other theoretical descriptions presented herein in reference to the apparatus or methods of this disclosure have been provided for the purposes of better understanding and are not intended to be limiting in scope. The apparatus and methods in the appended claims are not limited to those apparatus and methods which function in the manner described by such theories of operation.

Representative multimode fiber combiners are described below that can provide superior mode matching to diode lasers and reduced losses in brightness associated with combining beams from many fibers into a single fiber. In addition, some examples permit superior heat sinking. While the disclosed combiners (also referred to as couplers) can include one or more fiber types such as step index fibers, gradient index fibers, double clad fibers, in some examples, fibers having a gradient index core with a selected refractive index step at a core/cladding boundary are preferred. Such fibers can be referred to as gradient-step fibers. For convenience, such fibers are described first, and then fiber couplers based on these or other fiber types are described. For convenience, gradient-step fibers having circular cross-sections are described, but in other examples, square, rectangular, triangular, polygonal, elliptical, or other cross-sections can be provided.

As used herein, a gradient-step index fiber is an optical fiber having a gradient index core and a cladding surrounding the gradient index core such that the core/cladding boundary is associated with a numerical aperture of at least about 0.04. The gradient index of the core can be achieved with a smoothly varying refractive index or with a series of small refractive index steeps. In addition, the gradient index core region can include one or more other cores such as a single mode step index core.

While waveguides can be used in various wavelength ranges, the examples described in detail herein (silica-based optical fibers) are generally configured for use at wavelengths between about 300 nm and 2 µm, and particularly between about 600 nm and 2 µm.

In typical examples, portions of two or more fibers are secured to each other to form a fiber bundle. Each of the fibers typically has a free portion that is independently positionable, typically for coupling to an optical radiation source such as a laser diode. The fiber bundle can be fused together and/or tapered. In some examples, the bundled fibers are optically coupled to each other so that radiation entering the bundle on one fiber is coupled to one or more or all of the remaining fibers. In other examples, the fibers remain optically uncoupled in the bundle, even if fused and tapered. Fiber bundles (including fused and tapered bundles) can be coupled to output fibers by, for example, fusion splicing so that optical radiation in the fibers is combined in the output fiber. Fiber bundle/output fiber combinations can be referred to as combiners.

In most practical examples, fiber core cross-sectional area and shape are approximately matched when fiber bundles are coupled to individual fibers. For convenience, cross sections are referred to herein as corresponding whenever area and shape are configured to permit coupling efficiencies of at least 50%, 75%, 80%, 90%, 95% or more between bundles and output fibers. In addition, the examples described below are based on optical fibers, but other types of optical waveguides can be similarly configured in a waveguide bundle, as an output waveguide, and such waveguides can used in both close packed grouping (i.e., a bundle) and as output waveguides.

Optical radiation propagating in free space at a wavelength $\lambda$ has an effective wavelength in an optical fiber that is approximately the free space wavelength divided by an index of refraction of a fiber cladding. Typical fiber cladding refractive indices are between 1.4 and 1.5, and free space wavelengths are generally between 600 nm and 1.6 µm. Fibers whose cores are situated with about two effective wavelengths tend to be strongly optically coupled, i.e., optical radiation is coupled among the fibers. Fibers situated so as to be separated by about ten times an effective wavelength tend to be uncoupled. By selecting separations between two (or less) and ten times (or more) an effective wavelength, a particular amount of coupling can be selected.

Gradient Index/Step Index Fibers

Optical fibers or other optical waveguide are generally based on a variation of refractive index as a function of distance from a propagation axis. Such refractive index variations include so-called index steps such as those associated with a discontinuity radially in the composition of the glass in the fiber and continuous variations such as those associated with typical gradient index fibers whose composition has a continuous radial variation. Many convenient examples are based on optical fibers with circular cross-sections. Such fibers generally include a central core that is surrounded by a cladding region where the optical properties of the core and cladding are selected to provide guided wave transmission. A representative multimode fiber coupled system based on a step index fiber is illustrated in FIG. 6.

Figure 6:
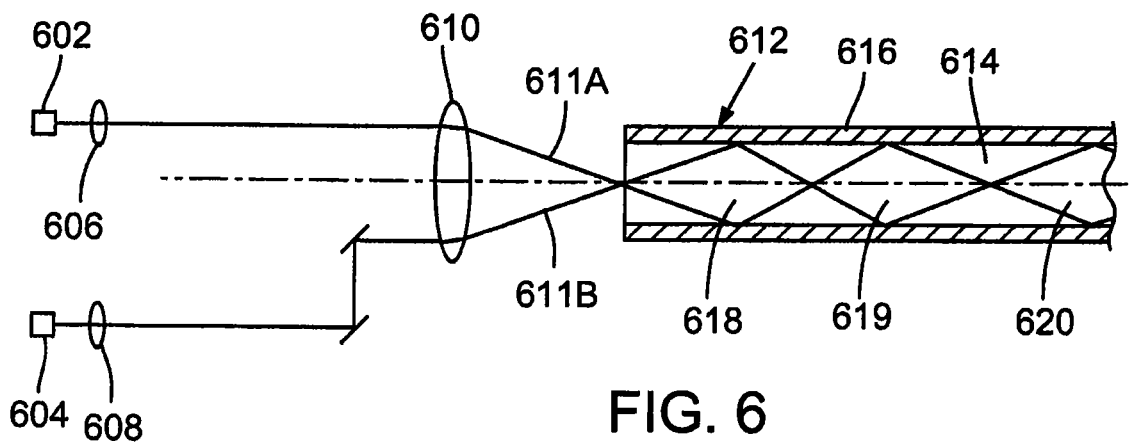
FIG. 6 is a schematic diagram of a laser diode based illuminator that includes a step index output fiber.
Figure 7A:
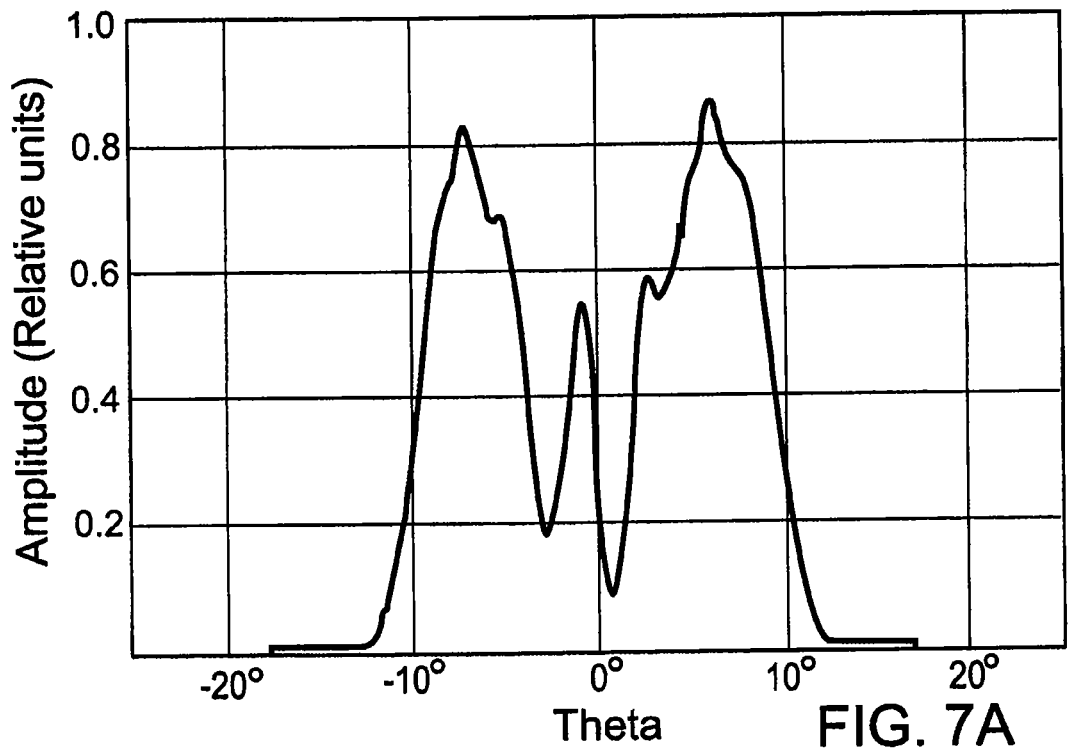
FIGS. 7A-7B illustrate output power distributions associated with the illuminator of FIG. 6. The distribution of FIG. 7A is produced with an unstressed fiber and the distribution of FIG. 7B is produced with a stressed fiber.
Figure 7B:
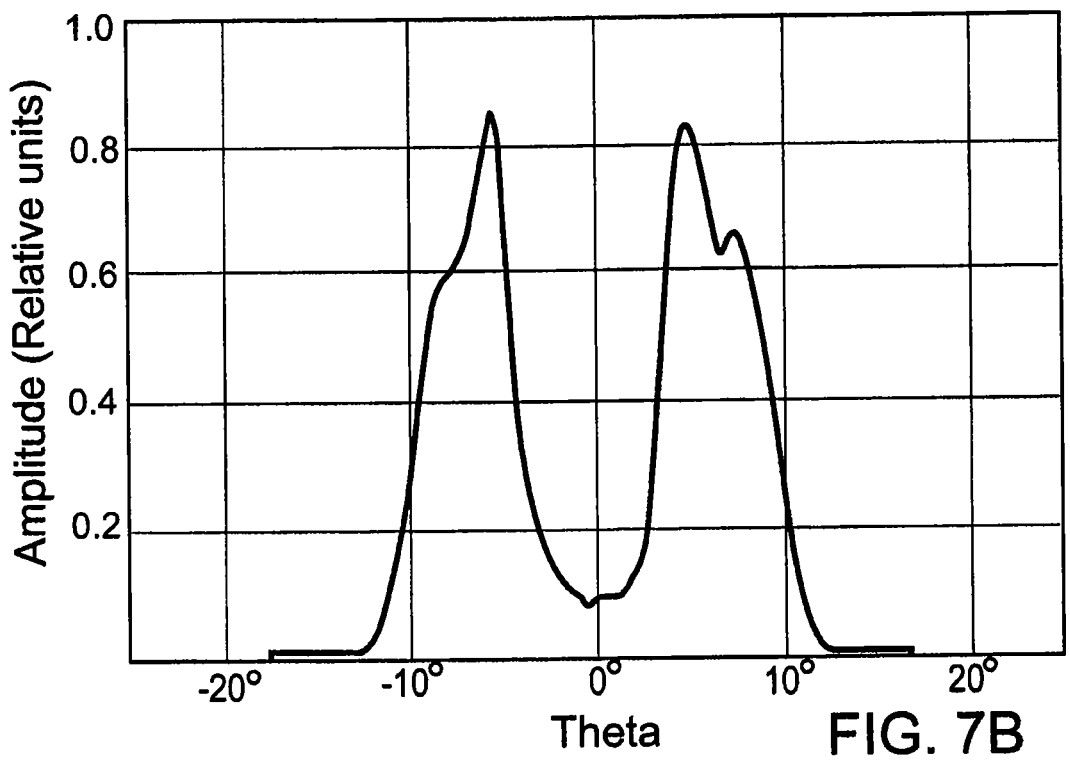

As shown in FIG. 6, laser diodes 602, 604 produce outputs that are collimated by respective lenses 606, 608 and the collimated beams are incident to a combiner lens 610. The beams are focused and directed into an optical fiber 612 along axes 611A, 611B. The optical fiber 612 includes a core 614 and a cladding 616, and has propagation characteristics based on an index difference between the core 614 and the cladding 616. Step index fiber largely preserves the angular distribution of the light that is launched into it. As a result, the output power distributions, as shown in FIGS. 7A-7B, have a donut-like appearance with reduced optical power on-axis. In addition, if the optical fiber 612 is subjected to slight external perturbations or otherwise disturbed, the power distribution of FIG. 7A changes into that of FIG. 7B. Thus, the system of FIG. 6 produces an output power distribution that is both non-uniform with a central hole and sensitive to fiber movement. Such non-uniform, unstable power distributions are problematic in many applications.

The sensitivity of the output beam to fiber perturbations can also be shown by measuring the amount of power contained within cones of various angular sizes. The angular dimension of a beam is typically referred by numerical aperture (NA) which is a quantity defined as sine of half of the divergence angle. In this way, a perfectly collimated beam has an NA of 0 where a beam that diverges to fill a half sphere has an NA of 1. Table 1 shows the relative amount of power in cones of various NA's for a step index fiber that is transmitting more than 20 Watts of optical power. In this experiment, the light from numerous laser diodes is coupled into a step index multimode fiber. One end of the fiber is aligned and fixed relative to the optical system that couples the diode laser light into the fiber. The other end of the fiber is fixed relative to the power meter that measures the amount of optical power transmitted through the fiber. The remainder of the fiber is placed on the optical table. The optical fiber itself is flexible and it is not placed or positioned in any particular way. Once the output beam is characterized, the fiber is placed or positioned in a second equally arbitrary way.

TABLE 1

Relative power in cones of varying numerical apertures for conventional step index fiber.

| Cone NA | Relative Power (first position) | Relative Power (second position) |
|---|---|---|
| 0.087 | 0.205 | 0.166 |
| 0.174 | 0.904 | 0.912 |
| 0.707 | 1.000 | 1.000 |

As shown by the data of Table 1 and FIGS. 7A-7B, output power distribution depends on fiber position when step index fibers are used for beam delivery, particularly at low cone angles. As noted earlier, this dependence of output beam properties on fiber position is particularly detrimental to numerous applications.

A representative example of a multimode fiber based on both an index step and a gradient index is illustrated in FIGS. 1A-1B. As shown in FIGS. 1A-1B a section of fiber 100 includes a core 102, a cladding 104, and a buffer coating 106 that define a propagation axis 108. The core 102 generally consists of fused silica that is doped so as to have a refractive index that varies continuously (generally decreases monotonically) as a function of radial distance from the propagation axis 108, but other refractive index variations such as those based on one or more index steps can be used. The cladding 104 is typically a fluorine doped glass, and the buffer layer 106 is an acrylate. In some examples, an additional buffer can be provided, such as a hard elastomeric buffer coating. In the example of FIGS. 1A-1B, the core, cladding, and buffer diameters are about 600 μm, 720 μm, and 1050 μm, respectively. The core 102 and cladding 104 are preferably concentric to within about 9 μm.

The core 102 and the cladding 104 are configured to have a refractive index n(r) that is a function of radial distance r from the axis 108:

n(r)=1.4366, for |r|>0.3 mm, and $$n(r) = 1.4698\left(1 - 0.2494\frac{r^2}{2}\right),$$

for |r|<0.3 mm, wherein r is measured in mm. This refractive index profile is illustrated in FIG. 2A.

Figure 2B:
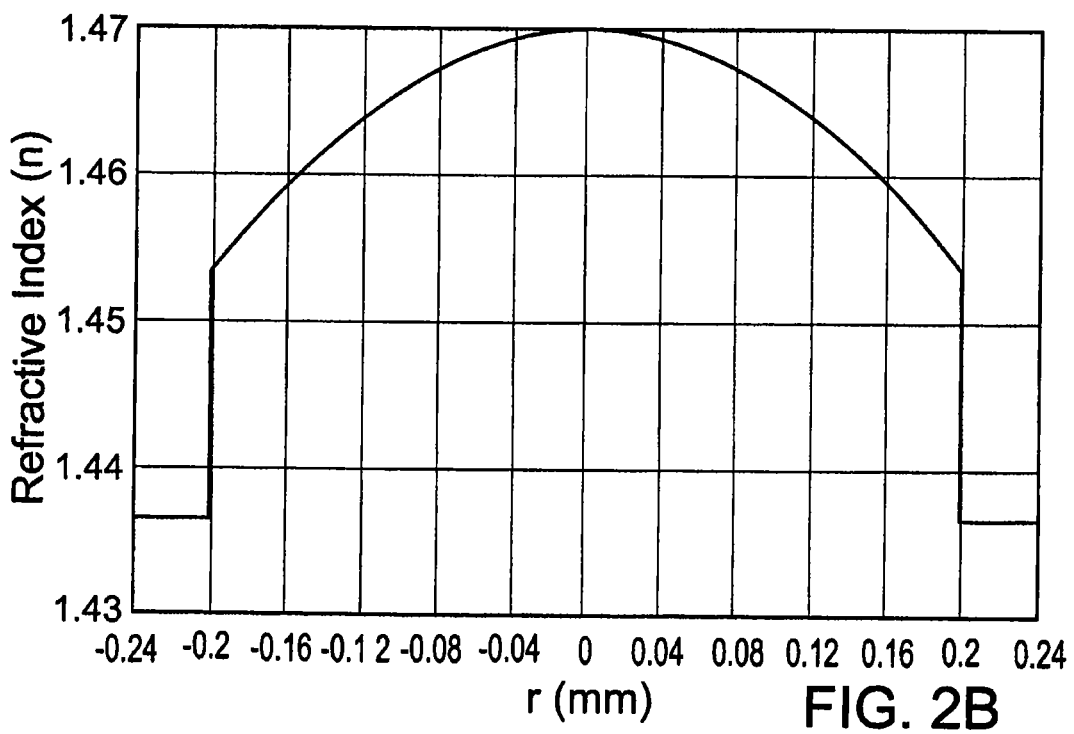
FIG. 2B is a graph of refractive index as a function of radial distance from a fiber propagation axis for another example optical fiber similar to that illustrated in FIGS. 1A-1B but having different core and cladding dimensions.

The particular variable refractive index and dimensions associated with FIGS. 1A-1B are examples only. In another example, core, cladding, and buffer diameters are 400 μm, 480 μm, and 750 μm, respectively, and the refractive index n(r) is given by:

n(r)=1.4366, for |r|>0.2 mm, and $$n(r) = 1.4699\left(1 - 0.563\frac{r^2}{2}\right),$$

for |r|<0.2 mm, wherein r is in units of mm. This refractive index profile is illustrated in FIG. 2B.

In the examples described above, the refractive index profiles n(r) are selected so that numerical apertures associated with the gradient index core and the core/cladding boundary are substantially the same, but in other examples these numerical apertures can be different. For example, the numerical aperture associated with the core/cladding boundary can be greater than, less than, or substantially the same as that of the gradient index core. In addition, while gradient profiles are described in some examples as substantially continuous functions of radial distance r, in other examples, gradient index fibers are based on a series of 2, 3, 4, 5, 6, or more refractive index steps or a combination of steps and substantially continuous functions. In some examples, such index steps are spaced between about, 0.1 μm, 0.2 μm, 0.5 μm, 1.0 μm, 10.0 μm or other larger or smaller spacings. A refractive index step at a core/cladding boundary need not be abrupt, but can extend over distances that are generally substantially less than a core dimension, typically less than about 0.1%, 1%, 2%, or 5% of a core dimension. For convenience, a step index refers to a change in refractive index Δn over a distance d such that dΔn is less than about 1%, 2%, or 10% of a wavelength to be propagated. Thus, a series of small refractive index steps can serve to define a gradient index fiber. In any case, depending on application requirements, refractive index can increase or decrease in a fiber core as a function of radial coordinate. Fibers having variable refractive indices in a fiber core and a core/cladding refractive index configured to provide a selected spatial and angular distribution are referred to herein as light shaping fibers. While the disclosed examples are directed to radially symmetric fibers, a core minimum or maximum refractive index need not be at a fiber center.

While parabolic refractive index profiles can be convenient, gradient indices can be based on other powers or combinations of powers of the radial coordinate r ($r^3$, $r^4$, $r^5$) or other functional forms. As noted above, a series of two or more index steps can be configured to approximate a continuous refractive index variation.

Other suitable fiber designs are described in Mehl, U.S. patent application Ser. No. 12/421,509, filed Apr. 9, 2009, that is incorporated herein by reference.

For typical gradient index and step index fiber designs, fiber numerical aperture is approximately $n_1\sqrt{2\Delta}$, wherein $$\Delta = \frac{n_1^2 - n_2^2}{2n_1^2},$$

$n_1$ is a refractive index at fiber center (gradient index) or in a fiber core (step index), and $n_2$ is refractive index just inside a core/cladding boundary (gradient index) or is a cladding refractive index. For the index profiles of FIGS. 2A-2B in which a graded index core terminates at an index step, $n_1$ is the refractive index at the center of the core, and $n_2$ is the lowest refractive index associated with the gradient index core, i.e., the refractive index of the gradient index core at the core/cladding interface. For determination of the numerical aperture associated with the core/cladding boundary, $n_1$ is the refractive index of the outermost portion of the gradient index core, and $n_2$ is the refractive index of the cladding. By selecting these values appropriately so that the numerical apertures are substantially the same, the numerical aperture of the fiber is substantially constant as a function of the radial distance $|r|$. This reduces propagation losses and tends to provide uniform, stable intensity distributions that remain substantially constant, even if the fiber is bent or is moved. As noted above, in other examples, the core/cladding boundary can be associated with numerical apertures that are less than or greater than that of the core. In typical examples, the core/cladding boundary is associated with a numerical aperture that is between about 0.04 and 0.50, and the core and the core/cladding boundary numerical apertures need not be the same.

Figure 3A:
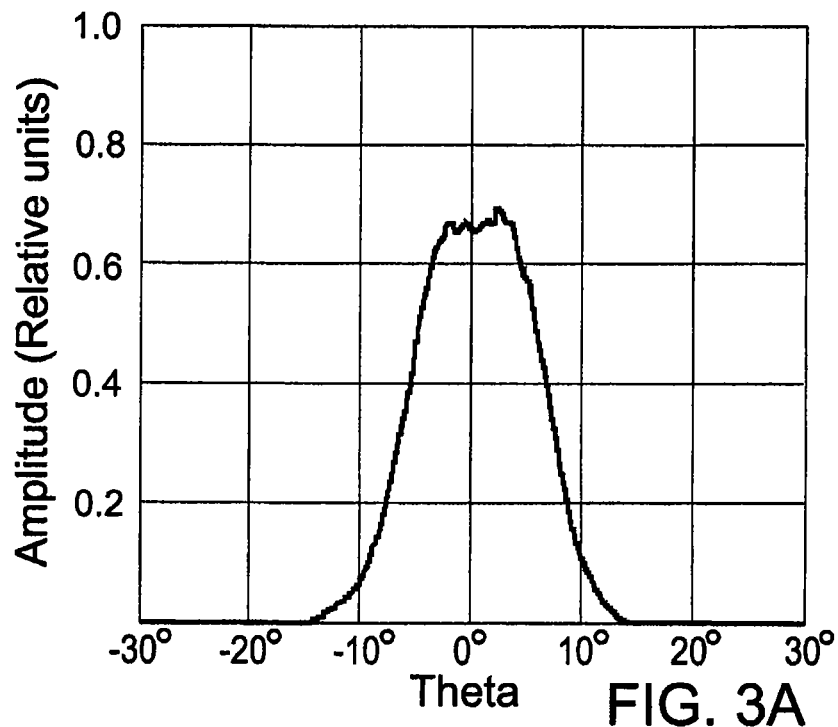
FIGS. 3A-3B illustrate measured output power as a function of output angle for a representative gradient index fiber with a core/cladding index step. The output powers of FIG. 3A and FIG. 3B are measured with unstressed fiber and stressed fiber (50 mm bend diameter), respectively.
Figure 3B:
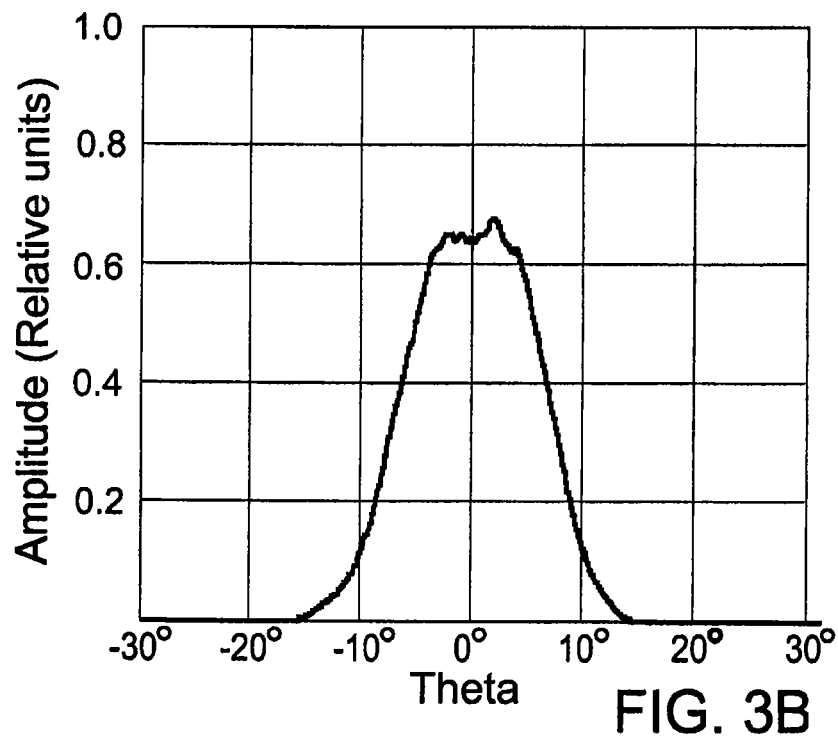

In another example, a representative fiber has a 550 μm gradient index core with a design refractive index $n(r)=1.4366$, for $|r|>0.275$ mm, and $$n(r) = 1.4698\left(1 - 0.245\frac{r^2}{2}\right),$$

for $|r|<0.275$ mm, was fabricated. A length of such fiber (about 1-2 m) was coupled to a laser diode array similar to that described in Farmer et al., U.S. Patent Application Publication 2007/0116077, and output powers as a function of output angle θ were measured with results as shown in FIGS. 3A-3B. FIG. 3A corresponds to an unstressed (straight) fiber length and FIG. 3B corresponds to a stressed fiber produced by bending. Relative powers in cones of varying numerical apertures ("cone NA") produced by stressed and unstressed fibers as described above are listed in Table 3. Fiber stress was produced by wrapping a section of fiber to form a bend of radius of about 50 mm.

TABLE 2

Relative power in cones of varying numerical apertures.

| Cone NA | Relative Power (Unstressed Fiber) | Relative Power (Stressed Fiber) |
|---|---|---|
| 0.087 | 0.40 | 0.40 |
| 0.174 | 0.91 | 0.91 |
| 0.707 | 1.00 | 1.00 |

Output numerical aperture was also measured corresponding to a beam angular radius that captures various fractions of total output power (for example, 50%, 90%, and 95%). Results are summarized in Table 3.

TABLE 3

Measured output beam NA as function of captured beampower.

| Relative Power | Output NA Unstressed Fiber | Output NA Stressed Fiber |
|---|---|---|
| 50% | 0.099 | 0.101 |
| 90% | 0.170 | 0.170 |
| 95% | 0.191 | 0.190 |

As shown in FIGS. 3A-3B, an optical flux produced by a gradient index fiber with an index step at a core/cladding interface provides stable power output with power variations of less than about 0.5%, 1%, 2%, 5%, or 10% in cones of numerical aperture greater than 0.05 even if the fiber is moved or bent. In addition, an angular power distribution remains substantially constant with numerical apertures ranging up to at least 0.2. In addition, output power distributions have maximum powers substantially on-axis. Fibers and systems that provide distributions having central or on-axis maxima (or approximate maxima) and for which power decreases substantially monotonically as a function of angle are referred to herein as center-enhanced fibers and systems. In some examples, power distributions provided by such fibers and systems are approximately Gaussian, but other distributions can be obtained.

Center-enhanced fibers can receive input optical power having relatively little power at some numerical apertures, typically at low numerical apertures and produce Gaussian or other power distributions having substantially or approximately maximum optical power on-axis. In this way, beams whose modal content yield far field profiles resembling a donut can be converted into beams with far field profiles that more closely resemble a Gaussian or other profile. In the disclosed examples, index gradients that decrease monotonically from a maximum on-axis refractive index are described. In other examples, gradient index profiles that have on-axis local relative minima can be provided to obtain output power distributions that are more uniform than Gaussian. Additional relative minima can also be provided to shape output power distribution for a particular application.

Figure 4A:
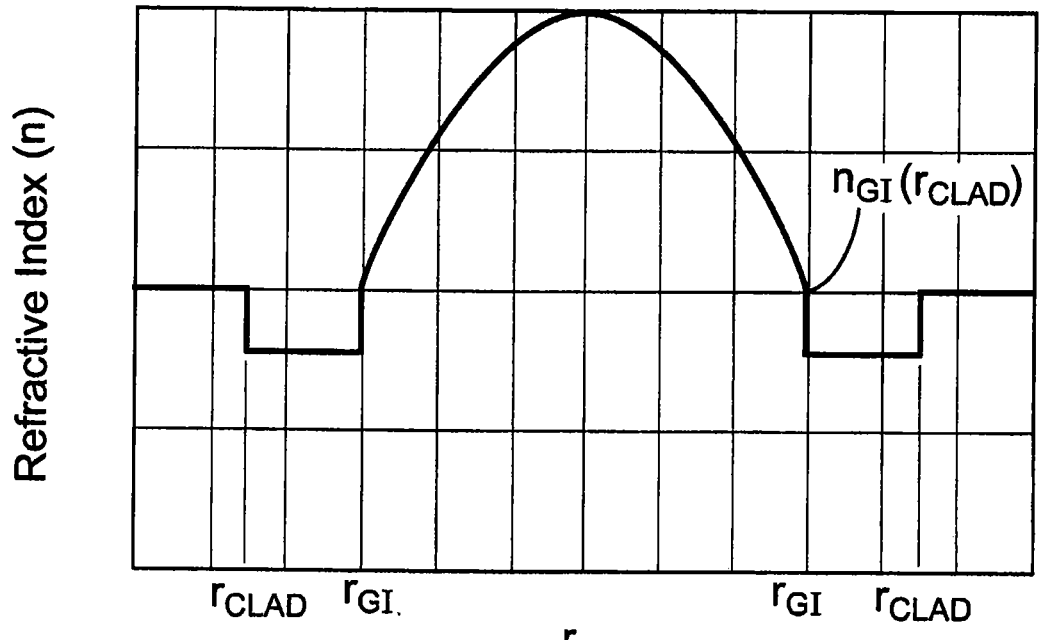
FIG. 4A-4B are graphs of refractive index as a function of radial distance from a fiber propagation axis for additional exemplary fibers.
Figure 4B:
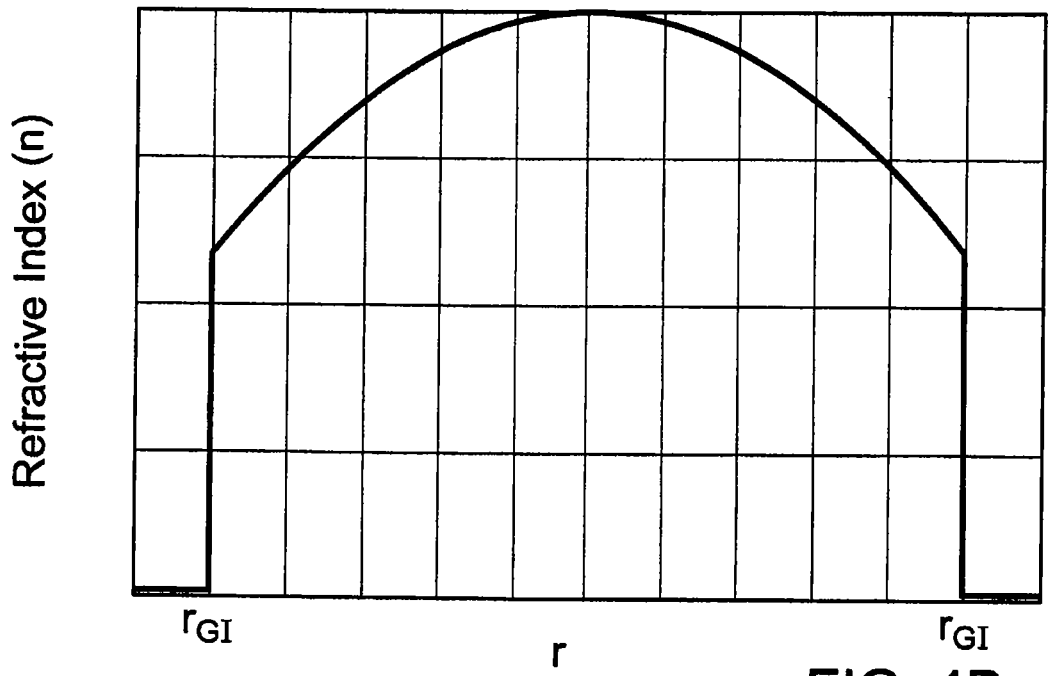

Additional representative refractive index profiles are illustrated in FIGS. 4A-4B. As shown in FIG. 4A, a fiber has a gradient index core of radius $r_{GI}$ and a cladding of radius $r_{CLAD}$, wherein a refractive index difference provided by the gradient index core is larger than a refractive index difference at the core/cladding boundary. Accordingly, a core numerical aperture is greater than a numerical aperture associated with the core/cladding boundary. In the example of FIG. 4B, a fiber has a gradient index core of radius $r_{GI}$ and a cladding of radius $r_{CLAD}$, wherein a refractive index difference provided by the gradient index core is smaller than a refractive index difference at the core/cladding boundary. Accordingly, a core numerical aperture is smaller than a numerical aperture associated with the core/cladding boundary. The example of FIG. 4B also includes a buffer region or an additional cladding region that surrounds the core and cladding, and has a refractive index that is greater than that of the cladding.

Figure 5A:
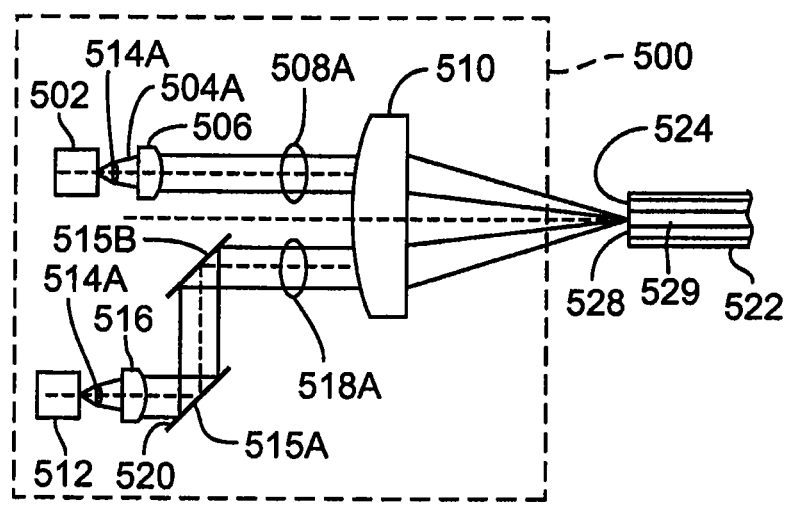
FIG. 5A is an elevational view of an illumination system.
Figure 5B:
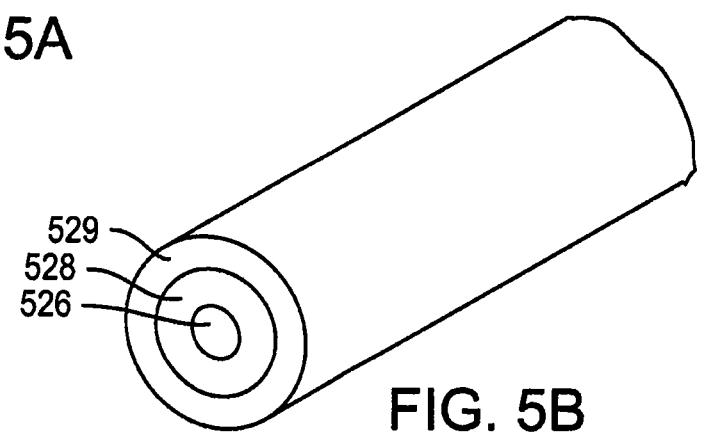
FIG. 5B is a sectional view of the optical fiber of FIG. 5A.

A representative laser beam delivery system that includes a fiber such as those described above is shown in FIGS. 5A-5D. In the plan view of FIG. 5A, an optical radiation source 500 is configured to deliver a plurality of optical beams to an optical fiber 522. The optical radiation source 500 typically includes one or more diode laser arrays such as laser diode arrays 502, 512. As shown in FIG. 5C, the laser diode array 502 includes laser diodes 502A-502E that are configured to emit respective optical beams. For convenient illustration, optical beams only from one laser diode from each of the laser diode arrays 502, 512 are shown in FIG. 5A, and in the plan view of FIG. 5A, the remaining beams and beam processing lenses would substantially overlap with the illustrated beams. In the following description, these illustrated beams are referred to as the selected beams and corresponding laser diodes are referred to as the selected laser diodes. Some examples of suitable laser arrays are described in, for example, Farmer et al., U.S. Patent Application Publication 2007/0116077 that is incorporated herein by reference.

Referring further to FIG. 5C, optical radiation from the selected laser diode 502A of the array 502 is directed to a first lens 504A and a second lens 506A that are selected to produce an approximately collimated or otherwise processed optical beam 508A that is incident to a combiner lens 510. Optical radiation from the selected laser diode of the array 512 is directed to a first lens 514A and a second lens 516A that are selected to produce an approximately collimated or otherwise processed optical beam 518A that is incident to the combiner lens 510 via reflective surfaces 515A, 515B that can be provided with mirrors or as surfaces of one or more prisms. The lenses 504A, 514A and the lenses 506A, 516A have substantially the same optical prescriptions such as thickness, radii of curvature, material type, aspheric coefficients, etc. Additional lenses are provided for each of the laser diodes in the arrays 502, 512. In other examples, one or more unitary lens assemblies such as those described in Karlsen, U.S. Patent Application Publication 2007/0086501 that is incorporated herein by reference can be used to collimate or otherwise form optical beams.

Referring to FIG. 5C, laser diodes 502A-502E are conveniently secured to a stepped mounting block 540 that is formed of a thermally conductive material such as copper. The laser diodes 502A-502C are provided with first lenses 504A-504C and second lenses 506A-506C, respectively. Additional lenses for lasers 502D-502F are not shown.

Figure 5D:
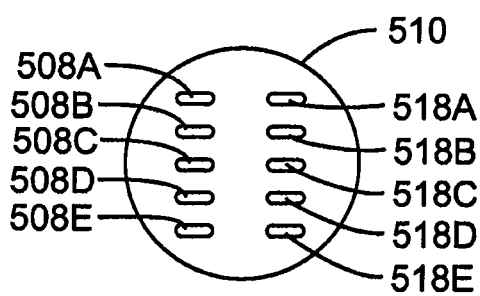
FIG. 5D illustrates a combiner lens and locations on the combiner lens at which beams from each of the lasers of the array of FIG. 5C are incident to the combiner lens.
Figure 5C:
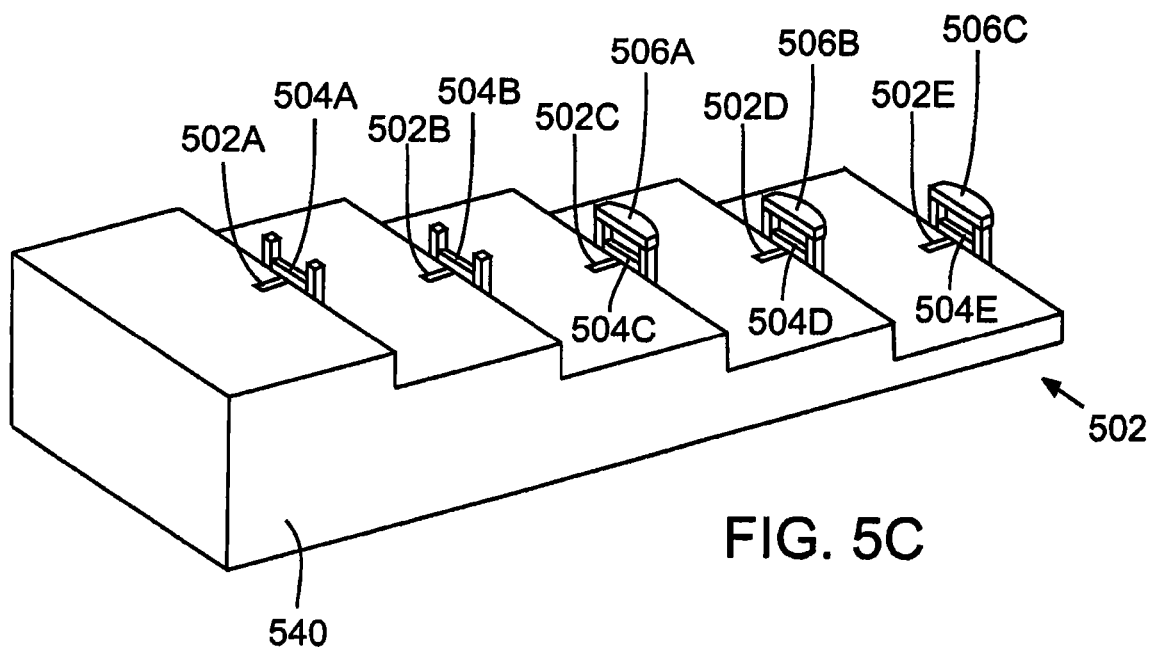
FIG. 5C illustrates representative laser arrays for the system of FIG. 5A.

Referring to FIG. 5D, the optical beams 508A, 518A are shown as incident to the combiner lens 510. Additional beams 508B-508E from the laser diodes 502B-502E, respectively, of the laser diode array 502 and additional beams 518B-518E from the laser diode array 512 are also shown. These beams are substantially parallel as incident to the beam combiner lens 510, and are combined at an entrance surface 524 of the fiber 522. As shown in FIG. 5A, the optical radiation source 500 includes two diode arrays each having five laser diodes but more or fewer diode arrays having more or fewer laser diodes can be used. Each laser diode can have one or more emitters. In some examples, single emitters can be used. Different numbers of laser diodes and/or arrays can be used in the optical radiation source 500. In addition, different wavelength ranges or combinations of wavelength ranges can be provided to the fiber 522 as preferred for a particular application.

The fiber 522 includes a core 526, a cladding 528, and a buffer 529. The core 526 is provided with a gradient refractive index by suitable doping, and a cladding refractive index is selected to provide an index step at a core/cladding interface. In some examples, the core/cladding index step is approximately the same as an index difference between core maximum and minimum refractive indices. In other examples, the index difference between the core and the cladding can be greater than about 0.01, 0.02, 05, 0.10, 0.20, 0.3, or more.

While particular examples are described above, in other examples fibers can have different core sizes ranging from about 1 μm to about 2.0 mm, and refractive indices of cores and claddings can be in a range of from about 1.2 to about 5.0 depending on optical radiation wavelength and material selection. Fibers typically have circular cross-sectional areas, but in other examples square, rectangular, polygonal, elliptical, or oval cross-sectional area or combinations thereof can be used. Core refractive index can vary as a function of $|r|^p$, wherein p is a positive number. Typically p is about two, but other values can be used, and in practice, slight deviations from a selected p value are obtained in fibers fabricated based on a particular refractive index variation. In many examples, $1.0 < p < 3.5$. Selected refractive indices can be provided by ion diffusion, solution doping or other processes such as those based on fiber preforms comprising nanometer sized particles selected to provide suitable refractive indices or to include passive or active dopants. In additional examples, double clad fibers can be formed in which a graded index core and a cladding are configured as described above based on a common numerical aperture or a core/cladding boundary numerical aperture different than the numerical aperture of the core, and an active or other multimode or single mode core is provided in the multimode core. In the disclosed examples, a cladding refractive index is substantially constant, but in other examples, the cladding can have a variable refractive index that can vary in a similar manner as the core.

The examples are conveniently described based on intended dimensions and refractive indices and refractive index variations. In addition, propagation axes are illustrated as centered in a fiber core. In fibers manufactured based on such specifications, fiber dimensions, refractive indices, core centration and other characteristics generally differ somewhat from design values. It will be appreciated that such variations are within the scope of the disclosed technology and are encompassed by the appended claims.

Typical practical fibers include one or more buffer layers that can have different refractive indices than either the fiber core or cladding, and can be made of materials that may or may not be appreciably optically transmissive. Generally, fiber core specifications such as shape, size, and refractive index are selected so that optical radiation is substantially confined within the core with some penetration into the cladding. Buffer layers are generally situated sufficiently distant from the core so that optical propagation is generally unaffected by the optical properties of the buffer. However, in some examples, the buffer can be configured to serve as a protective layer as well as a fiber cladding.

Representative Couplers

Figure 8A:
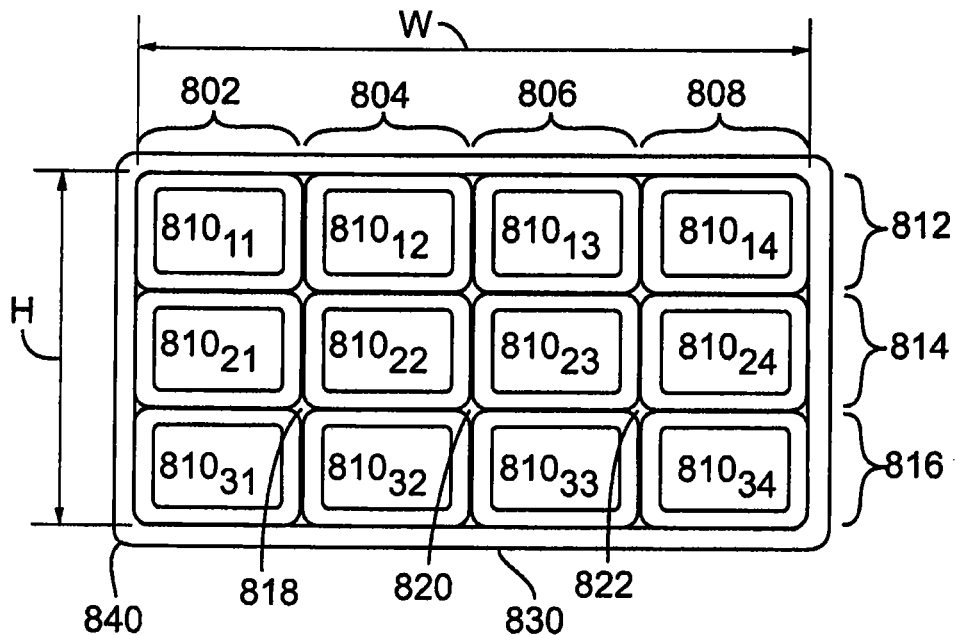
FIG. 8A is view of a coupling surface of a tapered coupler that includes a plurality of rectangular waveguides.
Figure 8B:
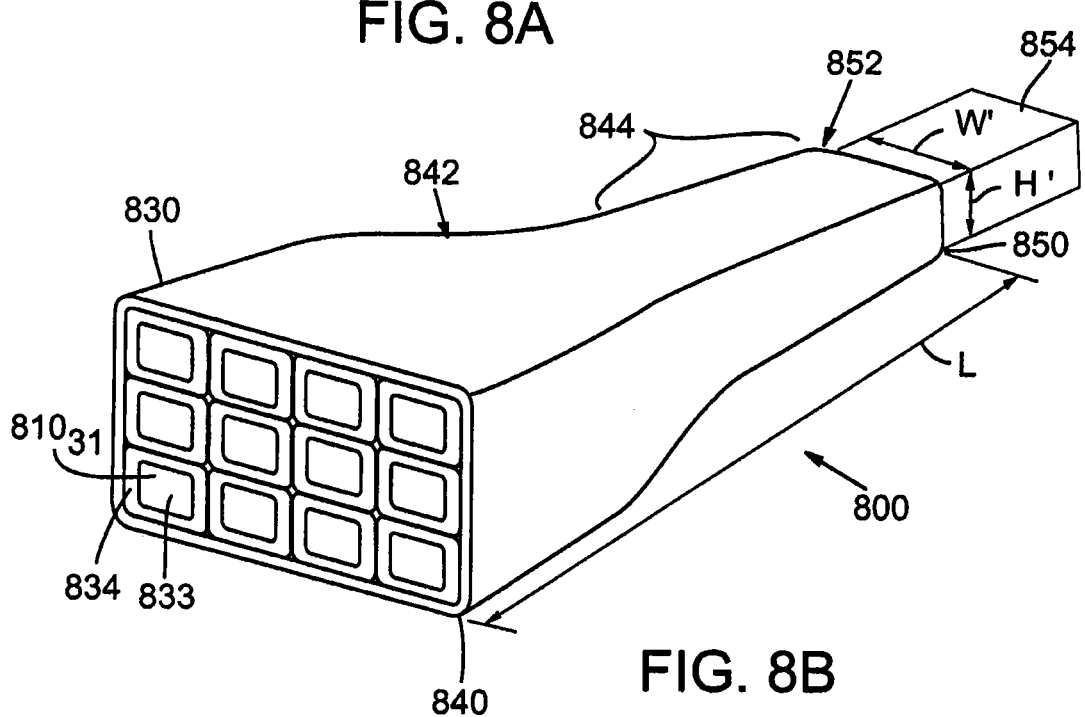
FIG. 8B is a perspective view of the tapered coupler of FIG. 8A.

With reference to FIGS. 8A-8B, a tapered coupler 800 includes a plurality of optical fibers (or other waveguides) 810 that are arranged in a rectangular array that includes columns 802, 804, 806, 808 and rows 812, 814, 816. Cross-sections of each of the optical fibers 810 are substantially rectangular and the optical fibers 810 are substantially adjacent one another to reduce (or eliminate) inter-fiber spaces such as spaces 818, 820, 822. In some examples, the spaces 818, 820, 822 remain empty, but in other examples in which fibers are melted and fused, the spaces are filled. The fibers 810 are encapsulated in a rectangular tube 830. The optical fibers 810 typically include a core 833 and a cladding 834 that are configured so that the core 833 has a higher index of refraction than the cladding 834 so that optical radiation propagates primarily within the core 833 without unacceptable power losses. The selection of fiber cores and claddings is generally based on so-called step index or gradient index designs or combinations thereof. Typically, a refractive index difference (step index) between the core and the cladding is selected along with core and cladding dimensions to provide selected beam propagation and beam shape characteristics. The gradient/step index designs described above often provide stable, uniform optical power distributions.

As shown in FIG. 8A, at a first coupling surface 840, the fiber array 810 of the tapered coupler 800 has a width W and a height H, and each of the fibers has a corresponding cross-sectional width w and height h. Typically each of the fibers 810 has substantially the same cross-sectional dimensions, but in other examples, one or more of the fibers 810 can consist of another fiber array, preferably an array that substantially fills the volume that would be occupied by a single fiber. In some examples, the rectangular fibers are substantially square in cross-section, but in other examples, trapezoidal or other shapes can be used. A plurality of fibers of differing cross-sections such as triangular, hexagonal, or square can be used and configured to reduce or eliminate any inter-fiber voids or spaces. In some examples, combinations of different fiber types such as double clad, gradient index, or step index fibers can be used. Although optical fibers are conveniently used in many practical examples, other waveguide structures such as planar waveguides can be configured to define a coupling surface.

Referring to FIG. 8B, the tapered coupler 800 has a length L measured from the first coupling surface 840 to a second coupling surface 850 that has a width W' and a height H'. At the second coupling surface 850, each of the fibers 810 has a corresponding cross-sectional width w' and height h'. As shown in FIG. 8B, the coupler 800 is tapered over a portion 842 of the length L and the fibers 810 are fused in a fused and tapered region 844, and the taper is not uniform along the length L. In other examples, the tapered coupler 800 tapers substantially uniformly along the length L between the first coupling surface 840 and the second coupling surface 850, and the coupling surface 850 is approximately circular. In other examples, both the regions 842, 844 provide tapering and fusing. Generally, tapers are gradual and satisfy an adiabatic condition. Typically, the tapered coupler 800 is spliced to a fiber 854 in a splice region 852. In some examples, the fiber 854 is a rectangular double clad fiber, a rectangular step index fiber, or other fiber.

Figure 9A:
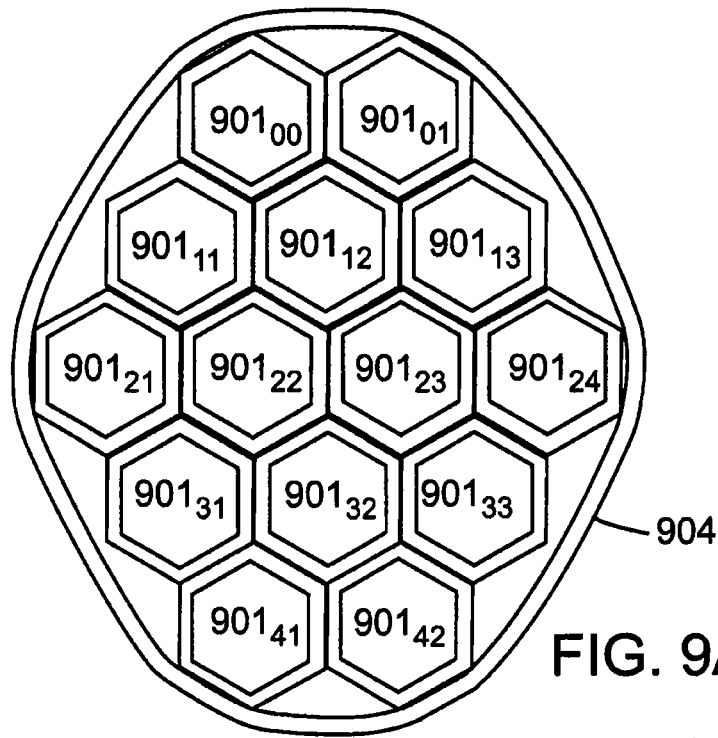
FIGS. 9A-9B are views of a tapered coupler that includes a plurality of fibers having hexagonal cross-sections.
Figure 9B:
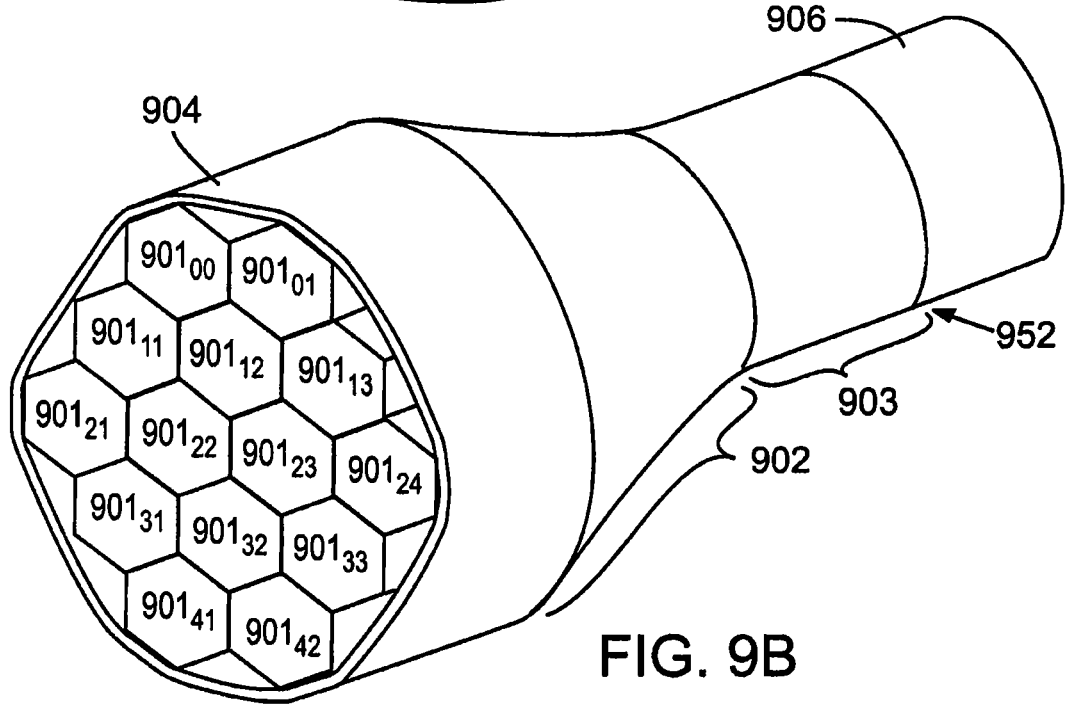

FIGS. 9A-9B illustrate a tapered coupler 900 that includes a plurality of optical fibers 901 having hexagonal cross-sections. As shown in FIG. 9A, the fibers 901 are closely packed so as to reduce or eliminate spaces between the fibers 901. A tapered section 902 is provided but a gradual or continuous taper can be provided as well. The tapered section generally terminates in a fused section 903 having a circular cross-section. In some examples, the sections 902, 903 are both tapered and fused. The optical fibers 901 can be step index or gradient index fibers, or other types of waveguides. Typically the fibers 901 are encapsulated by an external sheath 904 as shown in FIG. 9A. The external sheath 904 is generally selected so as to substantially conform to an exterior surface of the fibers 901 so as to protect the fibers and to aid in fiber geometry preservation during any tapering operations as described below. The coupler 900 is spliced to a fiber 906 in a splice region 952. The fiber 906 can be a parabolic index fiber, a step index fiber, or a double clad fiber. In the example of FIGS. 9A-9B, both the section 903 and the fiber 906 have circular cross-sections at the splice region 952.

Figure 10A:
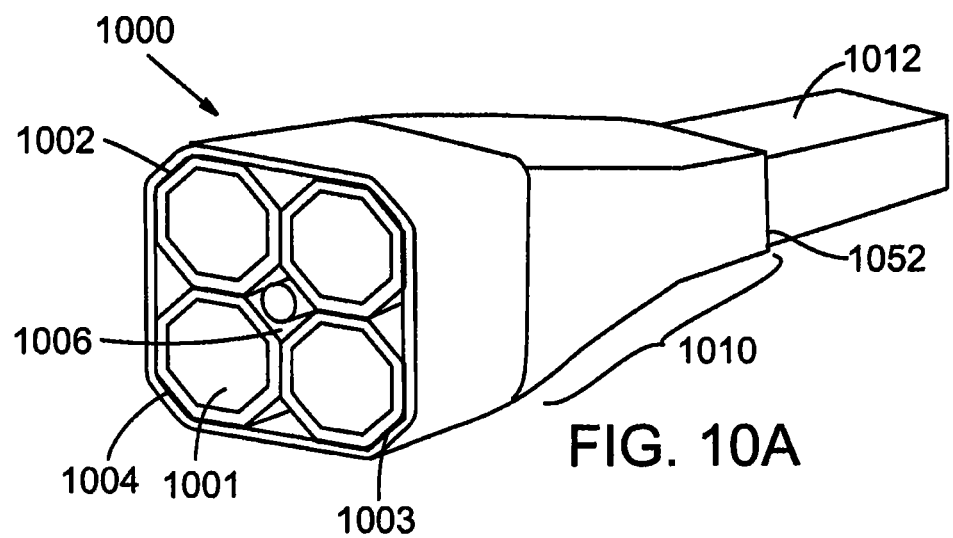

FIGS. 10A-10B illustrate coupler 1000 that include four hexagonal fibers 1001-1004 and a central feed-through 1006. In some examples, the fibers 1001-1004 are configured to receive pump radiation, and the feed-through 1006 is configured to provide optical gain in response to the pump radiation. In some examples, the feed-through is a small core configured as a signal fiber that can propagate a visible beam for alignment purposes, or a beam that is to be amplified by one or more doped regions, typically rare earth doped regions. The feed-through 1006 is preferably centrally located as shown in FIGS. 10A-10B. As shown in FIG. 10A, the coupler 1000 includes a fused and tapered region 1010 in which the fibers 1001-1004 are fused together and tapered for splicing to an output fiber 1012 at a splice region 1052. The output fiber 1012 can have a square, circular, or other cross-section, and can be a double clad fiber or a single clad fiber, and can include a core configured to couple to the central feed-through 1006.

FIGS. 11A-11C illustrate a tapered coupler based on an array of optical fibers having octagonal cross-sections. A typical fiber 1100 is illustrated in FIG. 11A and includes a core 1102 and cladding 1104. Step index designs are convenient. An array 1110 of such fibers is shown in FIG. 11B arranged so that each fiber substantially contacts adjacent fibers. A sheath 1106 is situated around the array 1110 and can be configured to protect the fiber array or to promote preservation of fiber shape when the fiber array is drawn or stretched. The array 1110 also defines inter-fiber regions 1112, 1114 that can remain unfilled, or fibers of square, round, or other cross-sections can be provided so as to fill or partially fill the inter-fiber regions 1112, 1114. As shown in FIG. 11C, a corresponding coupler 1120 includes one or more tapered, fused, or tapered and fused regions 1122, 1123 that serve to communicate optical radiation between coupling surfaces 1130, 1132. In some examples, the coupling surface 1132 is circular and a fiber 1140 is spliced to the coupler surface 1130 in a splice region 1152. The fiber 1140 can have a rectangular or circular cross-section that corresponds to the cross-section of the coupling surface 1132.

FIGS. 12A-12B illustrate additional fiber cross-sectional areas that can be provided for optical fibers used to form couplers. As shown in FIG. 12A, a representative fiber 1200 includes a rectangular core 1202 and a circular cladding 1204 that surrounds the rectangular core 1202. A fiber 1250 shown in FIG. 12B includes a square core 1252 and a circular cladding 1254. The cladding 1254 is selected to have an outside diameter approximately corresponding to a diagonal of the rectangular core 1252 so that portions 1254A-1254D of the cladding 1254 are unconnected or nearly unconnected at corners 1252A-1252D. Typically, the cladding diameter is selected so that the cladding is relatively thin at the corners 1252A-1252D, but typically at least as thick as about 2, 5, 10, 20, or 50 times a design wavelength in a range of from about 250 nm to about 2.5 µm. In some examples, the cladding diameter is selected so that the portions 1254A-1254D are unconnected. In typical examples, a cladding thickness is selected to be at least about 10 times a wavelength of optical radiation to be used with the fiber.

Referring to FIG. 13, a coupler 1300 includes fibers 1302, 1304, 1306 having respective rectangular coupling end surfaces 1303, 1305, 1307 that are configured to serve as input or output surfaces. The fibers 1302, 1304, 1306 are partially retained in a sheath 1322, and are situated so as to be in contact to form an array that is a single row. In other examples, two dimensional arrays can be formed. The fibers 1302, 1304, 1306 taper in a taper region 1320 that is typically formed by heating and pulling a portion of the fiber assembly. As shown in FIG. 13, rectangular end surfaces 1312, 1314, 1316 of the fibers 1302, 1304, 1306 have shapes corresponding to the end surfaces 1302, 1306, 1308, but have smaller areas. In this example, input or output fiber surfaces (for example, surfaces 1303, 1305, 1307) can be situated independently to receive or provide an optical flux.

In typical examples, the cross-sections of the fibers 1302, 1304, 1306 are rectangular or other shapes. In the example of FIG. 13, three fibers situated to form a single row are provided, but in other examples fewer or more fibers can be provided and the fibers can be arranged in one or more rows and columns so as to form a one or two dimensional array, or can be arranged in some other configuration.

FIG. 14 is a sectional view of an array of adjacent rectangular fibers 1402, 1404, 1406, 1408, 1410 situated to form a single row. These fibers can be step index, gradient index, multi-mode, single mode, double clad or other types of optical fibers. As shown in FIG. 14, a sheath or an additional cladding 1412 encapsulates the rectangular fibers 1402, 1404, 1406, 1408, 1410 and the fiber 1406 is a double clad fiber. Typically pump radiation is directed to the fibers 1402, 1404, 1406, 1408, 1410, and an input optical signal is amplified by a doped portion of the fiber 1406. The cladding 1412 can be provided on substantially the entire length of the fiber array or only at a selected region to protect the fiber array or for aid in producing a taper. For applications in which substantial optical power propagates in the fibers 1402, 1404, 1406, 1408, 1410, top and bottom heat sinks 1414, 1416 or other active or passive thermal control devices such as Peltier effect devices can be thermally coupled to the fibers.

Combiners, illuminators, and other apparatus as described herein can use various types of fibers. In some examples, step index fibers with or without cladding (i.e. in which air serves as a cladding) can be used, and fiber cross-sectional shapes can be selected based on a particular application. Double clad fibers can also be used. Referring to FIG. 15, a fiber array includes fibers $1502_{I,J}$, for I, J=1, 2, 3 that are situated in contact. These fibers can be configured to be illuminated by one or more laser diodes as illustrated in FIGS. 9A-9C, and the cross-sectional dimensions can be larger or smaller than corresponding dimensions at other positions along the fiber 1502. The fiber $1502_{22}$ includes a feedthrough 1504, shown as a circular core centered in the fiber $1502_{22}$, but in other examples, the core 1504 can have an elliptical, oval, rectangular, hexagonal, or other cross-sectional shape. In addition, the core 1504 can be situated arbitrarily within the fiber $1502_{22}$. The portion of the fiber $1502_{22}$ outside the core 1504 is configured to serve as a cladding for the core 1504 and as a feed-through of an additional waveguide. In typical examples, the core 1504 or some portions thereof are doped so as to form a laser medium that can be pumped by optical radiation propagating in the fiber $1502_{22}$. In some applications, tapered couplers as shown in FIG. 15 are tapered for splicing to a double clad fiber.

Figure 16:
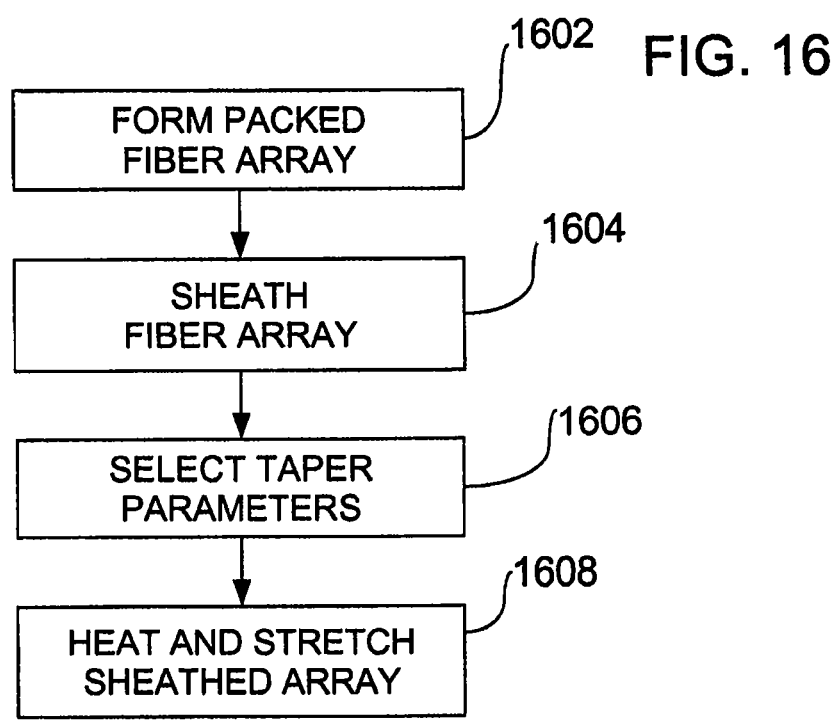
FIG. 16 is a block diagram of a representative fabrication method for tapered fiber couplers.

Tapered couplers can be conveniently formed as illustrated FIG. 16. In a step 1602, an array of fibers or other waveguides is arranged so that the fibers are closely packed. Generally, the fibers are configured into a bundle in which adjacent fibers are in contact, and fiber geometries that permit close packing are preferred. In a step 1604, a sheath or jacket is situated around the fiber bundle and preferably in contact (or nearly in contact) with an exterior surface of the fiber bundle. Typically the fibers and the sheath are formed of a glass (or glasses) or other materials that have the same or similar melting temperatures. Taper dimensions, locations, and other taper parameters are selected in a step 1606. Selected portions of the sheathed fiber bundle are heated sufficiently in a step 1608 so that the fiber/sheath assembly can be pulled so that fiber cross-sectional dimensions are reduced. In some examples, cross-sectional shape is also changed, and circular or oval cross-sections can be produced. The extent of reduction and the number and placement of the stretched portions can be selected based on a particular application.

While specific fiber geometries are used in the above examples, these geometries are selected for illustration only and are not to be taken as limiting the scope of the disclosed technology. Cross-sectional shapes and dimensions are generally selected based on a particular application as convenient. Fiber cross-sectional dimensions (such as height, width, radius) frequently are between about 0.002 mm and 2.0 mm, 0.05 mm and 1.0 mm, or less than about 0.5 mm. In many examples, rectangular fibers are packed together to form a substantially continuous input or output surface. Such surfaces (and the corresponding fiber bundles) are substantially free of inter-fiber spaces that are not used for propagation of optical radiation. In typical examples, less than about 30%, 25%, 20%, 10%, 5%, 2.5%, or 1% of the cross-sectional area is occupied by such inter-fiber spaces.

In typical examples, regular arrays of closely packed fibers are used. Rectangular or square fibers can be convenient, and arrays of N rows and M columns can be formed, wherein N, M are arbitrary positive integers. In some practical embodiments, N and M are between 1 and 7, and in some examples, a single row or column of N fibers can be provided, wherein N is between 1 and 7. In some examples, one or more of the fibers of the array is a double clad fiber that includes a doped core (typically rare earth doped) configured to serve as a laser medium in a laser oscillator or amplifier if suitably pumped via one or more fibers of the array. Convenient examples are based on fibers having 200 μm core diameters and 220 μm cladding diameters. Step index, gradient index, or combined gradient index/step index configurations can be used. In some examples, core diameters are selected so that core diameters of tapered fibers match the core diameters of fibers to which the tapered fibers are to be coupled. Typically, core/cladding diameter ratios of such fibers are substantially the same.

Figure 17:
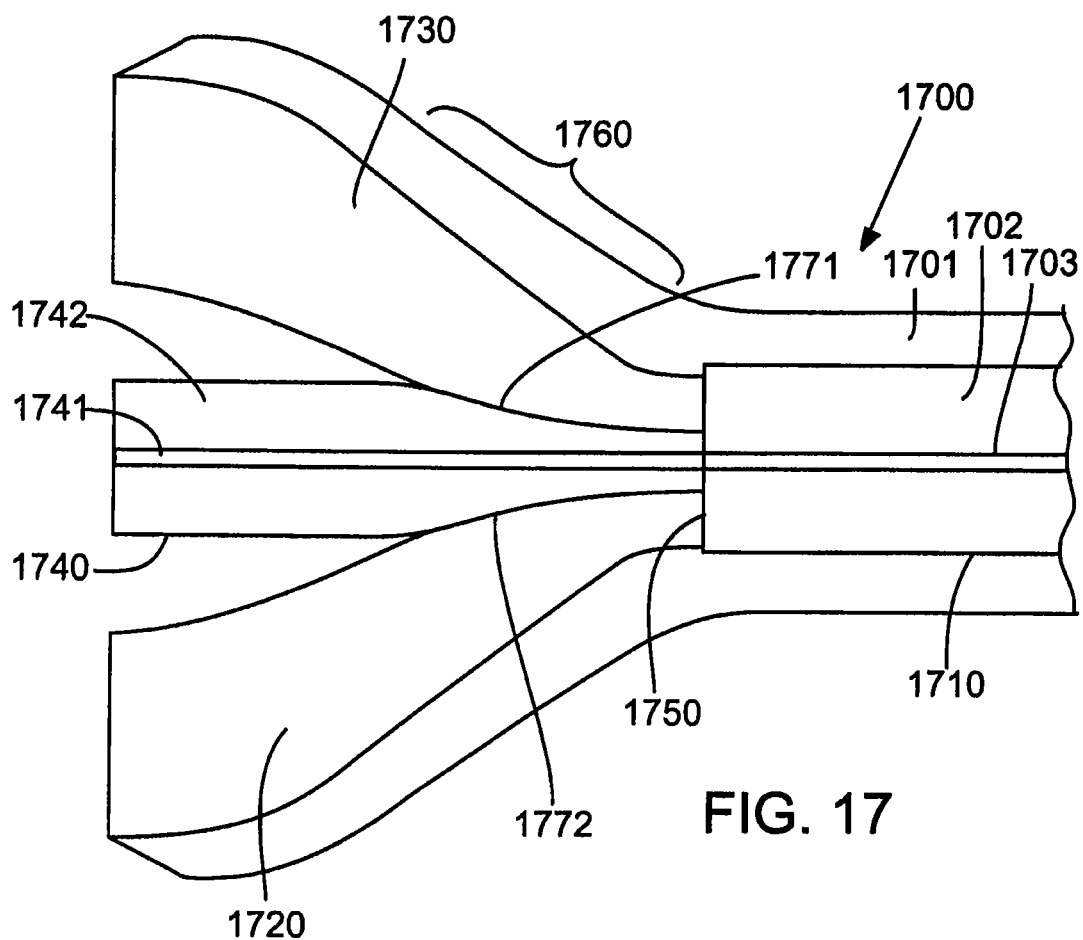
FIG. 17 illustrates a representative tapered coupler that includes three fibers that are tapered to form a fiber bundle that is spliced to an output fiber.

FIG. 17 shows an example of the types of couplers that can be made. In this drawing, three input fibers 1720, 1730 and 1740 are shown. A fiber 1730 is fused to a fiber 1740 at a surface 1771 and a fiber 1720 is fused to a fiber 1740 at a surface 1772. After being fused, the fibers 1720, 1730 and 1740 are tapered as shown in region 1760 to reduce their cross sectional areas, forming a tapered fiber bundle. In some cases, the fusing and tapering process can happen simultaneously. After fusing and tapering, the bundle is cleaved creating a surface 1750 that is spliced to an output fiber 1710. Following splicing, the entire device can be jacketed with a low index material 1701. This material could be any of a wide variety of substances including fluoropolymers, acrylates, air, or other materials.

As shown in FIG. 17, the fibers 1740 and 1710 have central cores 1741 and 1703 respectively, surrounded by claddings 1742 and 1702 respectively. These cores can be either single mode or multimode. Further, while cores 1741, 1703 are shown in FIG. 17, the combiner could also be fabricated without these cores. These cores act as a feed-through of optical power to be amplified but are typically unnecessary if the device is to be used only to combine power.

FIG. 17 shows a device with three input fibers only for clarity. The number of input fibers could be either more or less. Further, the cross sectional shape of the input fibers could be circular, square, rectangular, triangular, polygonal, elliptical or other shapes as well. The input fibers could be either step index or gradient index. Similarly, the output fiber could also be either step index or gradient index. Numerous beneficial configurations are shown in Table 4.

TABLE 4

Representative selections for the fibers 1730, 1740, 1710 for the example of FIG 17. The acronyms used are defined in Table 5.

| Configuration | 1730 | 1740 | 1710 |
| --- | --- | --- | --- |
| 1 | PF | LMA | LMA/DCF |
| 2 | PF | SMF | SMF/DCF |
| 3 | SI | LMA | LMA/PDCF |
| 4 | SI | SMF | SMF/PDCF |
| 5 | PF | PF | SI |
| 6 | SI | PF | SI |
| 7 | PF | SI | SI |
| 8 | SI | SI | PF |
| 9 | SI | PF | PF |
| 10 | PF | SI | PF |

TABLE 5

Acronyms used to identify the fiber types in the example configurations of Table 4.

| Acronym | Meaning | 1st core | 2nd core |
|---|---|---|---|
| LMA | Large mode area | few modes | none |
| SMF | Single mode fiber | one mode | none |
| PF | Parabolic fiber | many modes, parabolic index | none |
| SI | Step index | many modes, step index | |
| LMA/DCF | LMA/double clad fiber | few modes | many modes, step index |
| LMA/DCF | SMF/double clad fiber | one mode | many modes, step index |
| LMA/PDCF | LMA/parabolic DCF | few modes | many modes, parabolic index |
| SMF/PDCF | SMF/parabolic DCF | one mode | many modes, parabolic index |

Figure 18A:
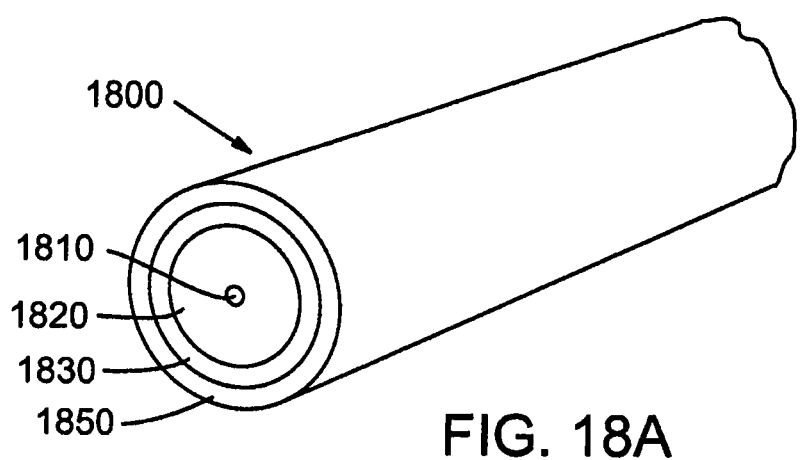
FIG. 18A illustrates a parabolic double clad fiber.

FIG. 18A illustrates an example of a parabolic double clad fiber 1800. The fiber 1800 includes a core 1810 (typically a step index core) which in most cases has a relatively a small diameter so as to function as a few mode or single mode fiber, and cladding layers 1820, 1830 both of which have a lower refractive index than the core. The cladding layer 1820 corresponds to a parabolic or step index region of the fiber, the cladding layer 1830 corresponds to a secondary or outer clad which can be either parabolic or step index. A jacketing material 1850 can be made from fluoropolymers, acrylates, air, or other materials. The outer jacketing can either be a higher or lower index than the core, the inner cladding or the outer cladding.

Figure 18B:
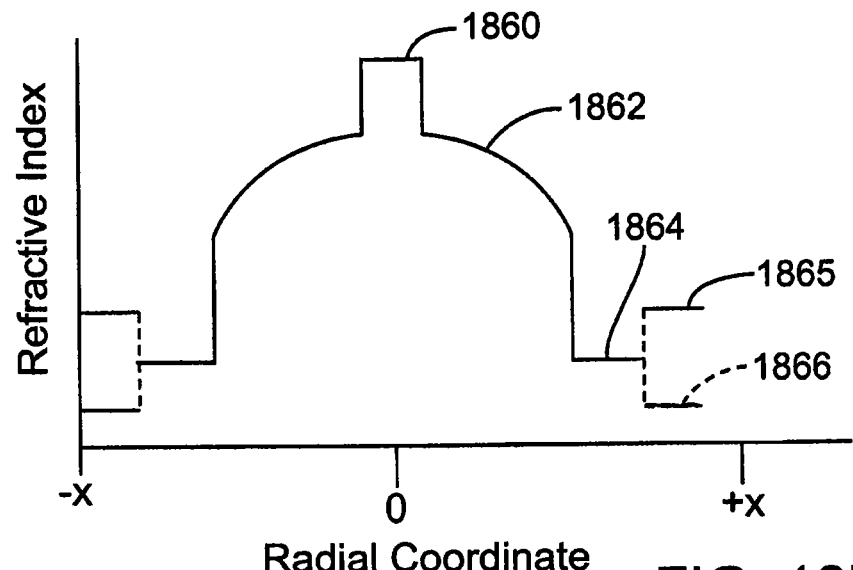
FIGS. 18B-18E illustrate representative refractive index profiles for the fiber of FIG. 18A.

FIG. 18B shows the refractive index profile of a core portion 1860, a parabolic clad portion 1862, a step index secondary cladding portion 1864 and a jacket material portion that can either have a higher (1865) or lower (1866) refractive index than the secondary cladding. In addition, the refractive index of the jacket material can be either higher or lower than that of the clad, the core, or the outer clad of the fiber.

Figure 18C:
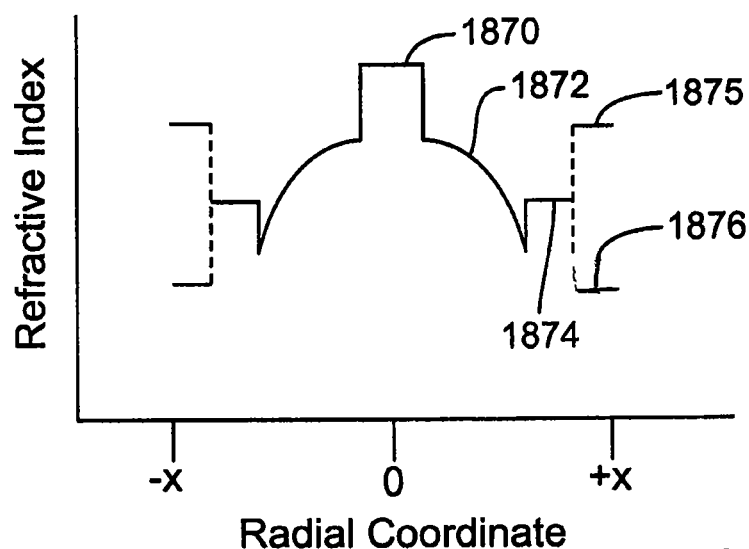

FIG. 18C shows the refractive index profile of a core portion 1870, a parabolic clad portion 1872, a step index secondary clad portion 1874, and a jacket portion that can have a higher (1875) or lower refractive index (1876) than that of the secondary clad, the core, or the parabolic clad.

Figure 18D:
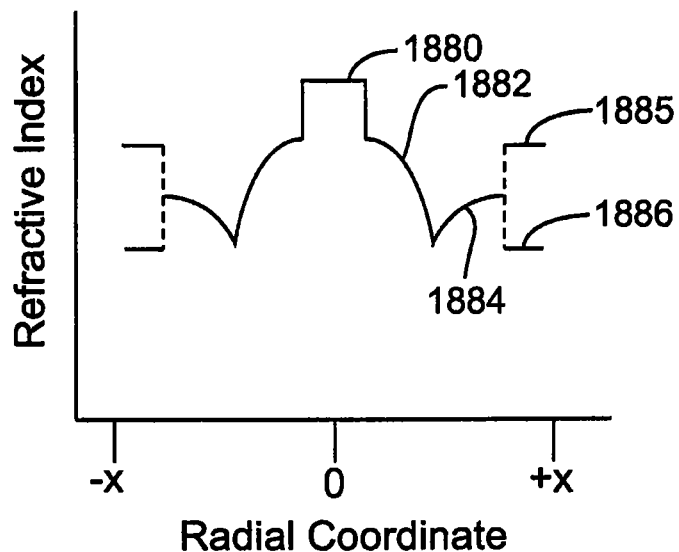

FIG. 18D shows the refractive index profile of a core portion 1880, a parabolic clad portion 1882, a parabolic secondary clad portion 1884, and an outer jacket portion that can have a higher refractive index (1885) or a lower refractive index (1886) than the secondary clad. The outer jacketing can have either a higher or lower index than the core, clad or outer cladding.

Figure 18E:
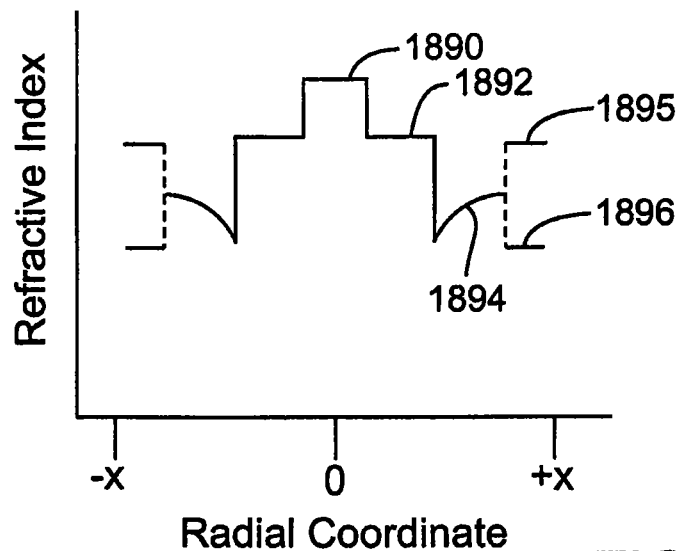

FIG. 18E shows the refractive index profile of a core portion 1890, a step index clad portion 1892, a parabolic secondary clad portion 1894, and an outer jacket portion that can have a higher refractive index (1895) or a lower refractive index (1896) than the secondary clad. The outer jacketing can have either a higher or lower refractive index than the core, clad or outer cladding.

Figure 19A:
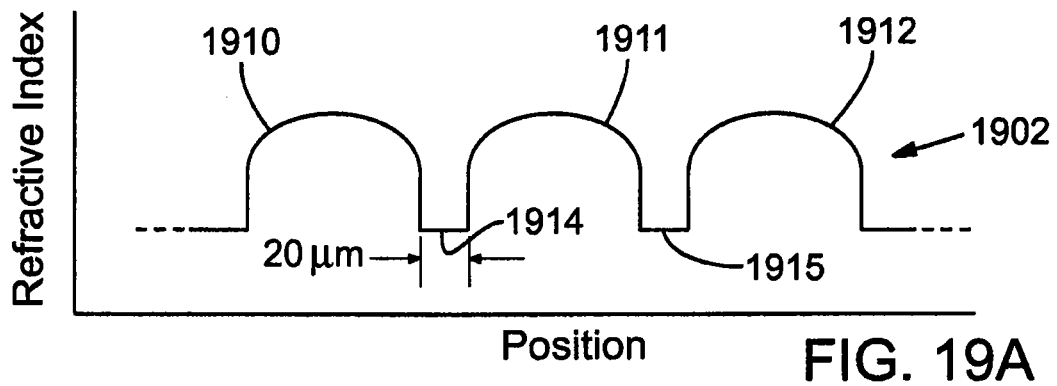
FIGS. 19A-19B illustrate refractive index profiles before and after tapering.
Figure 19B:
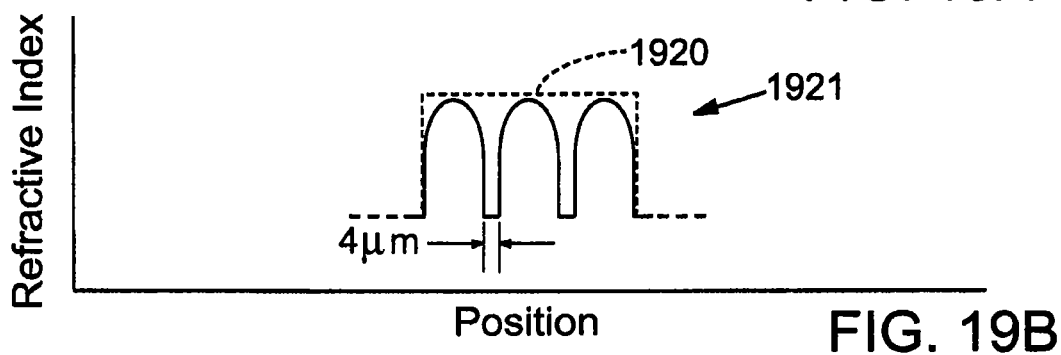

In some examples that include one or more tapered fibers, the tapering operation may reduce cladding thickness so that the fibers are optically coupled to each other due to the small separation provided by the tapered claddings. For example, referring to FIG. 19A, a refractive index profile 1902 before tapering includes fiber core regions 1910, 1911, 1912 that area separated by cladding regions 1914, 1915 that separate the core regions by about 20 µm. After tapering by a factor of 5, the tapered refractive index profile 1920 will have corresponding core regions that are separated by about 4 µm as shown in FIG. 19B. Separations of less than about 5 µm can result in cross-coupling among the core regions. Thus, in some examples, for a taper factor of T, a total cladding thickness $t_{CLAD}$ is selected so that $t_{CLAD}/T$ is greater than or less than about 5 µm, depending on whether coupling among the fibers in the bundle is desired. Also shown in FIG. 19B is a step index core profile 1920 that is approximated by the combination of the tapered cores 1910-1912. Leakage between the cores can be appreciated as resulting from the combination of the refractive index profiles of the tapered cores (such as tapered gradient index or step index cores) to approximate a step index core.

Figure 20A:
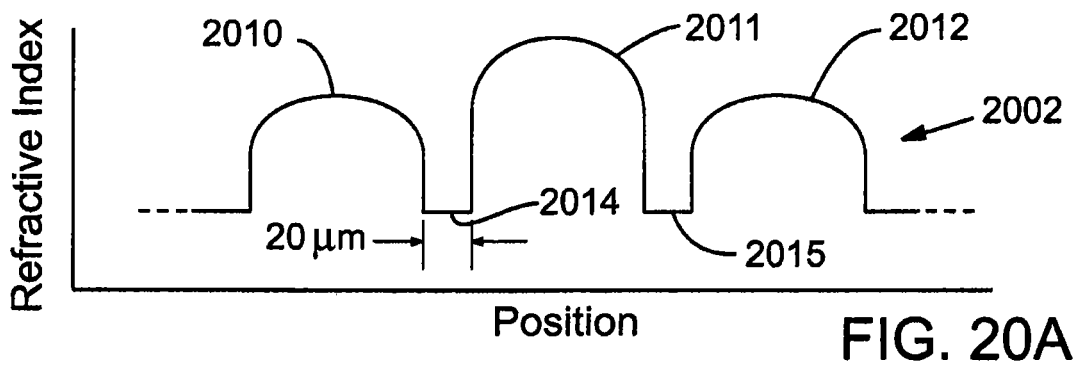
FIGS. 20A-20B illustrate refractive index profiles before and after tapering with a fiber group that includes a central fiber having a higher maximum core refractive index than that of adjacent fibers.
Figure 20B:
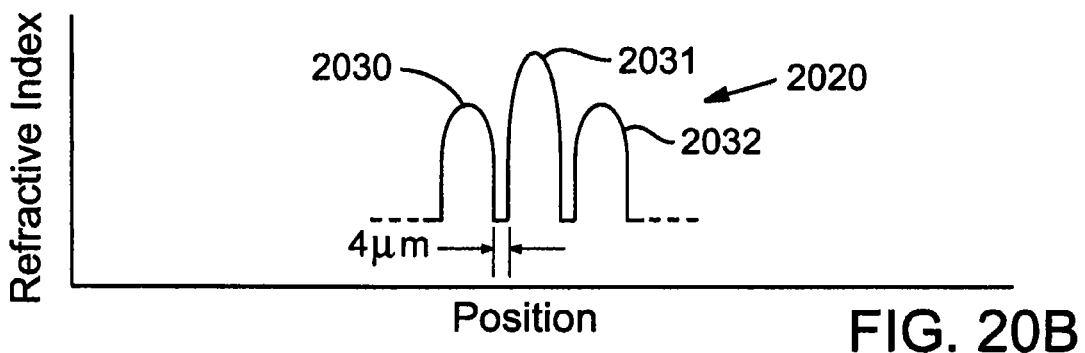

In other examples, a central fiber (or other fiber, if a decentered core is desired) can be provided with a larger refractive index than other fibers in a tapered bundle. With reference to FIG. 20A, a refractive index profile 2002 before tapering includes fiber core regions 2010, 2011, 2012 that are separated by about 20 µm by cladding regions 2014, 2015. After a 5× tapering operation, a refractive index profile 2020 shown in FIG. 20B is obtained. Because a large refractive index (and a larger refractive index difference) is provided by the core region 2011, the tapered bundle has tapered core regions 2030, 2031, 2032 that appear similar to a gradient index core of a core consisting of the three tapered core regions.

While in many applications, fiber coupler input fibers are all energized with optical radiation from one or more laser diodes or other sources, selective excitation of one or more fiber inputs can be used to tailor an output beam profile. For example, one or more input fibers can remain unenergized or power levels in one or more input fibers can be selected to provide a suitable output power distribution. Power level adjustment can be used to establish a preferred distribution or to maintain the distribution by, for example, feedback based control of the input radiation sources or input power couplings. In some examples, different portions of a combiner output are configured so as to provide independently controllable power distributions. For example, for a combiner based on a linear array of fibers or other waveguides, the output fibers can be individually controlled, and output powers can be directed to different work surfaces. For such applications, individual fibers are formed into a bundle that can be tapered as needed, but each of the fibers remains substantially optically separate from the other fibers to provide separate control of each fiber. In such configurations, power input to a selected fiber generally remains in the selected fiber with limited coupling into other fibers. In some examples, one or more or all fibers can be configured to be optically separate. By selecting a suitable fiber configuration and appropriate optical inputs, power distributions such as flat top, Gaussian, donut, or other distributions can be selected, and the power distribution can be varied as needed based on the optical inputs. In some examples, a light source controller is coupled to a plurality of light sources (typically laser diodes) that provide optical power to the beam combiner to provide such power distributions. A detection system can also be provided and coupled to the controller so that power and power distributions can be adjusted, selected, or maintained.

As noted above, fibers of different cross-sections can be arranged in various ways to form combiners. In a particular combiner, all fibers can be different, the same, or an arbitrary mixture of fiber shapes and sizes. Typically, fibers are fused together and tapered, and in many applications, the combiner output is spliced to an additional fiber that is used to deliver the combined output to a work surface or other location. In some examples, a tapered fiber bundle is enclosed or partially enclosed in a glass or other tube to secure the fibers in position and to reduce the likelihood of damage. In other examples, a glass sheet or other sheet is secured to at least a portion of the tapered bundle. A glass tube or sheet can be configured to protect or secure fibers, or to serve as a cladding that aids in guiding optical radiation. In some examples, one (or more) of the fibers used in a combiner is a small core fiber (possibly a single mode fiber) that is selected to propagate a signal beam such as a visible beam for beam alignment. In this case, an output fiber can include one or more corresponding small cores for coupling to the small core fibers of the combiner. Typically, the combiner includes only one signal fiber and the output fiber includes a single matching small core.

Various fiber types can be used as well, including double core, double clad, or other fiber types. In some examples, fiber cores or claddings are rare earth doped, or are otherwise doped to provide optical gain when pumped, or to enhance pump radiation absorption. In one example, a double clad fiber with a small rare earth doped core with a gradient-step index at an inner/outer cladding boundary is used.

One particularly advantageous arrangement for some applications is a linear array of fibers configured as a combiner. Such an array can be coupled to heat sinks or other thermal control devices on one or more sides of the array, and distances from array center to thermal control devices are relatively small so that the combiner can be temperature controlled effectively. In examples, individual laser diodes or other light sources can be coupled to respective input fibers, but fiber assemblies such as illustrated in FIG. 5A can also be used for one or more input fibers, typically to provide increased optical power.

It will be apparent that the disclosed embodiments are examples only, and are not to be taken as limiting the scope of the disclosed technology. Fiber types, numbers of fibers, fiber geometry, and other parameters can be selected for particular applications, but all such combinations are within the scope of this disclosure. For example, double clad fibers having offset cores or based on hexagonal or other pump core shapes can be used. In some configurations, such double clad fibers can provide increased power coupling to the double clad fiber core.

The examples disclosed herein are generally based on optical fibers, but other optically waveguides can be used. For example, planar optical waveguides can be similarly configured. Such waveguides are generally formed on a planar substrate such as glass, fused silica, $TiO_2$, or other substrate materials. Propagation characteristics can be established using a diffusion or other process, and photolithographic techniques can be used to define waveguide geometries. In other examples, hollow optical waveguides can be similarly arranged, or optical waveguides can be fabricated as a series of layers on a substrate.

In other examples, beam combiners are based on plurality of optical waveguides such as step index optical fibers. Each of the fibers has a core having a core refractive index and the fibers are situated so as to form a waveguide defined by the combination of the cores. Typically, a tapered fiber region is formed in which the individual fiber cores are spaced apart by less than about 1-4 μm so that optical radiation can be coupled between the fibers. One of the fibers (or more) can have a larger core refractive index, and in combination with the remaining fibers, can approximate a stepwise gradient refractive index profile. In some examples, one or more centrally located fibers have relatively larger core refractive indices than other fibers, or fibers are arranged so that core refractive index is monotonically decreasing.

While single mode fibers are convenient in some examples, in other examples fibers that support a few modes can be used and are referred to herein as "few mode" fibers. Such fibers have a normalized frequency parameter (V-number) defined as $V=(2\pi a/\lambda)(n_{core}^2-n_{clad}^2)^{1/2}$, wherein $\lambda$ is vacuum wavelength, a is a fiber core radius, and $n_{core}$, $n_{clad}$ are fiber core and fiber cladding refractive indices, respectively. A total number M of modes supported by a fiber is $M=4V^2/\pi^2$. For single mode fibers, V is less than about 2.405. As used herein, a few mode fiber is defined as a fiber for which a V-number is less than about 2.5, 3, 3.5, 4, 4.5, or 5.

In some examples, so-called double clad or double core fibers are used. A double clad fiber typically includes a core, an inner cladding, and an outer cladding. The core is typically selected to define a single mode (or few mode) waveguide, while the inner cladding defines a multimode core. Generally, a refractive index difference between the inner cladding and the outer cladding is relatively large so that a numerical aperture of the multimode waveguide defined by the inner and outer claddings can be large. A double core fiber typically includes a first (inner) core, a second (outer) core, and an outer cladding. The first core is selected to define a single mode (or few mode) waveguide prior to any tapering. The second core is selected to define a single mode (or few mode) waveguide after tapering. Generally, refractive index differences between first core, second core, and outer cladding are relatively small.

In view of the preceding, we claim all that is encompassed by the appended claims.

We claim:

1. An optical waveguide assembly, comprising a first optical waveguide and a second optical waveguide wherein the first optical waveguide is a gradient-step waveguide having a waveguide numerical aperture based on a waveguide core dimension and a waveguide core refractive index gradient, and having a refractive index step at a core/cladding boundary such that $n_B\sqrt{2\Delta_1} \geq 0.04$, wherein $$\Delta_1 = \frac{n_B^2 - n_{CLAD}^2}{2n_B^2},$$

$n_B$ is a refractive index within the waveguide at the core/cladding boundary, and $n_{CLAD}$ is a cladding refractive index, wherein the first and second waveguides having respective independently positionable first and second input portions that extend into a bundled waveguide portion that defines an output surface operable to provide optical power received from the first and second input portions of the first and second waveguides, respectively.

2. The optical waveguide assembly of claim 1, wherein the first optical waveguide and the second optical waveguides are optical fibers.

3. The optical waveguide assembly of claim 2, wherein the bundled waveguide portion is fused and tapered so as to decrease cross-sectional areas of the first and second optical fibers by a factor of at least about 2.

4. The optical waveguide assembly of claim 2, further comprising an outer cladding about the bundled waveguide portion, wherein the outer cladding has a refractive index that is less than a refractive index of at least one of core's refractive indices at core/cladding interfaces of the first optical waveguide or the second optical waveguide.

5. The optical waveguide assembly of claim 2, wherein the claddings of the first and second optical waveguides separate cores of the first and second optical fibers by at least about two times an effective optical wavelength in the bundled waveguide portion.

6. The optical waveguide assembly of claim 2, wherein the claddings of the first and second optical waveguides separate cores of the first and second optical fibers by less than about ten times an effective optical wavelength in the bundled waveguide portion.

7. The optical waveguide assembly of claim 2, further comprising a plurality of fibers having independently positionable input portions that extend through the bundled waveguide portion to the output surface, wherein at least one of the optical fibers is centrally located in the bundled waveguide portion.

8. The optical waveguide assembly of claim 7, wherein the centrally located fiber is a double clad optical fiber.

9. The optical waveguide assembly of claim 8, wherein the centrally located fiber is a few mode optical fiber.

10. The optical waveguide assembly of claim 7, wherein the plurality of fibers is situated in the bundled waveguide portion so that optical radiation propagates substantially independently in the optical fibers.

11. The optical waveguide assembly of claim 2, wherein the plurality of fibers have substantially rectangular cross-sectional areas.

12. An optical waveguide assembly, comprising at least a first optical waveguide and a second optical waveguide wherein at least one of the first and second optical waveguides is a gradient-step waveguide, the first and second waveguides having respective independently positionable input portions that extend into a bundled waveguide portion that defines an output surface operable to provide optical power received from the first and second input portions of the first and second waveguides, respectively, wherein the first optical waveguide and the second optical waveguides are optical fibers, and wherein a cladding of at least one gradient-step index fiber has a refractive index $n_{CLAD}$, a core has a refractive index $n(0)$ near a core center and a refractive index $n(r_{MAX})$ at a core/cladding interface, wherein $n^2(r_{MAX})-n^2_{CLAD}$ is in a range of between about $[n^2(0)-n^2(r_{MAX})]/10$ and $2[n^2(0)-n^2(r_{MAX})]$.

13. The optical waveguide assembly of claim 12, wherein $n^2(r_{MAX})-n^2_{CLAD}$ is approximately equal to $n^2(0)-n^2(r_{MAX})$.

14. The optical waveguide assembly of claim 12, further comprising an output optical fiber coupled to the output surface.

15. The optical waveguide assembly of claim 14, wherein the output surface and a core of the optical fiber coupled to the output surface have corresponding rectangular cross-sectional areas.

16. The optical waveguide assembly of claim 15, wherein the bundled waveguide portions are fused and tapered.

17. The optical waveguide assembly of claim 14, wherein the output fiber is a gradient-step fiber.

18. The optical waveguide assembly of claim 9, wherein the double clad optical fiber is coupled to the output surface, wherein a cross-section of a core of the few mode fiber at the output surface corresponds to a few mode core of the double clad optical fiber, and a cross section of a multimode core of the double clad optical fiber corresponds to a cross section of the output surface of the bundled waveguide portion.

19. The optical waveguide assembly of claim 7, further comprising an output optical fiber coupled to the output surface, wherein a core of the output optical fiber and the output surface have corresponding cross-sections.

20. The optical waveguide assembly of claim 2, wherein a cross section of the output surface is rectangular.

21. A fiber assembly, comprising an optical waveguide assembly as recited in claim 2, wherein the optical waveguide assembly includes a double clad fiber coupled to the output surface, the double clad fiber including a few mode core situated in a multimode core.

22. The fiber assembly of claim 21, wherein a cross-section of the multimode core of the double clad fiber corresponds to an area of the output surface.

23. The fiber assembly of claim 21, wherein the few mode core is rare earth doped.

24. An optical apparatus, comprising:
the optical waveguide assembly of claim 2; and
at least first and second laser diodes coupled to the first and second optical waveguides, respectively.

25. The apparatus of claim 24, wherein the optical waveguide assembly comprises a plurality of optical waveguides coupled to respective laser diodes so that optical radiation from the plurality of laser diodes is coupled to a rare earth doped core so as to produce optical gain.

26. The apparatus of claim 25, wherein at least one of the optical waveguides of the optical waveguide assembly is situated so as to be coupled to overlapping optical beams from a plurality of laser diodes.

27. The apparatus of claim 25, wherein the optical waveguides of the optical waveguide assembly are situated so that optical power propagating in the optical waveguides is coupled among the optical waveguides.

28. An optical apparatus, comprising:
an optical waveguide assembly as recited in claim 14; and
first and second laser diodes optically coupled to the first and second optical waveguides of the optical waveguide assembly.

29. The apparatus of claim 28, wherein the optical waveguide assembly comprises a plurality of optical waveguides coupled to respective laser diodes so that optical radiation from the plurality of laser diodes is coupled to the output fiber.

30. The apparatus of claim 29, wherein at least one of the optical waveguides of the optical waveguide assembly is situated so as to be coupled to overlapping optical beams from a plurality of laser diodes.

31. The apparatus of claim 29, wherein the output surface of the optical waveguide assembly and a core of the output fiber are correspondingly rectangular.

32. The apparatus of claim 31, wherein the output fiber is a gradient-step fiber.

33. An optical assembly, comprising:
the optical waveguide assembly of claim 12, wherein the first optical waveguide and the second optical waveguide are input optical fibers, having rectangular cores and the output surface defined by the bundled waveguide portion is rectangular; and
an output fiber optically coupled to the output surface, wherein the output fiber has a rectangular core corresponding to the rectangular output surface of the bundled waveguide portion.

34. The assembly of claim 33, wherein the output fiber is a gradient-step fiber.

35. The assembly of claim 34, further comprising at least one light source optically coupled to each of the input fibers.

36. The assembly of claim 33, further comprising at least one light source optically coupled to each of the input fibers.

37. The assembly of claim 33, wherein at least one of the input fibers is a few mode fiber.

38. The assembly of claim 37, wherein the output fiber is a double clad fiber, wherein a cross section of a core of the at least one few mode input fiber corresponds to a cross section of a few mode core of the double clad fiber.

39. The assembly of claim 33, wherein the bundled waveguide portion is tapered so that a cross-sectional area is reduced by a factor of at least 1.5.

40. The assembly of claim 33, wherein the input fibers are situated in a linear array in the bundled waveguide portion, the bundled waveguide portion having first and second contact surfaces parallel to an array axis and an illumination propagation axis, and further comprising at least one thermal control device thermally contacted to at least one of the first and second contact surfaces.

41. The assembly of claim 40, wherein the bundled waveguide portion is tapered.

42. An optical illuminator, comprising:
the assembly of claim 33;
respective light sources optically coupled to the input optical fibers; and
a light source controller configured to independently adjust an optical radiation distribution provided by the light sources.

43. The optical illuminator of claim 42, further comprising a detection system configured to assess the optical radiation provided from the bundled waveguide portion and coupled to the light source controller, wherein the light source controller is configured to adjust one or more of the light sources based on the assessment.

44. An optical illuminator, comprising:
the assembly of claim 2;
first and second light sources optically coupled to the first and second input fibers; and
a light source controller configured to independently adjust an optical radiation distribution provided by the first and second light sources.

45. The optical illuminator of claim 44, further comprising a detection system configured to assess the optical radiation distribution provided from the bundled waveguide portion and coupled to the light source controller, wherein the light source controller is configured to adjust one or more of the light sources based on the assessment.

46. The optical waveguide assembly of claim 1, wherein the numerical aperture of the at least one of the first and second optical waveguides is defined by $n_B\sqrt{2\Delta_1}0.04$, wherein $$\Delta_1 = \frac{n_B^2 - n_{CLAD}^2}{2n_B^2},$$

$n_{CORE}$ is a refractive index at a waveguide center, $n_B$ is a refractive index within the waveguide at a core/cladding boundary, and $n_{CLAD}$ is a cladding refractive index, and a core numerical aperture is defined by a refractive index gradient in the waveguide core.

47. The optical waveguide assembly of claim 46, wherein the first and second optical waveguides are optical fibers, and at least one of the first and second optical waveguides has a core numerical aperture based on a core radius and the refractive index gradient in the core.

48. The optical waveguide assembly of claim 46, wherein the numerical aperture of the core is equal to $n_B\sqrt{2\Delta_1}$.

* * * * *